United States Patent [19]

Leedy

[11] Patent Number: 5,103,557
[45] Date of Patent: Apr. 14, 1992

[54] MAKING AND TESTING AN INTEGRATED CIRCUIT USING HIGH DENSITY PROBE POINTS

[76] Inventor: Glenn J. Leedy, 1061 E. Mountain Dr., Santa Barbara, Calif. 93108

[21] Appl. No.: 482,135

[22] Filed: Feb. 16, 1990

Related U.S. Application Data

[63] Continuation-in-part of Ser. No. 194,596, May 16, 1988, Pat. No. 4,924,589.

[51] Int. Cl.$^5$ .............................................. H05K 3/30
[52] U.S. Cl. ...................................... 29/832; 29/407; 29/846; 324/158 P; 437/8
[58] Field of Search ............... 29/407, 825, 846, 832; 324/158 P, 73 PC, 158 F; 437/8

[56] References Cited

U.S. PATENT DOCUMENTS

| | | | |
|---|---|---|---|
| 3,405,361 | 10/1968 | Kattner et al. | 324/158 P |
| 3,618,201 | 11/1971 | Makimoto et al. | 437/8 |
| 3,702,025 | 11/1972 | Archer | 437/8 |
| 3,905,818 | 9/1975 | Margrain | 96/36.2 |
| 4,038,599 | 6/1977 | Bove et al. | 324/158 F |
| 4,088,490 | 5/1978 | Duke et al. | 96/36.2 |
| 4,115,120 | 9/1978 | Dyer et al. | 96/36.2 |
| 4,409,319 | 10/1983 | Colacino et al. | 430/296 |
| 4,564,584 | 1/1986 | Fredericks et al. | 430/312 |
| 4,585,727 | 4/1985 | Reams | 430/312 |
| 4,636,722 | 1/1987 | Ardezzone | 324/158 P |
| 4,649,339 | 3/1987 | Grangroth et al. | 324/158 P X |
| 4,764,485 | 8/1988 | Loughran et al. | 437/225 |
| 4,820,976 | 4/1989 | Brown | 324/158 P X |
| 4,853,627 | 8/1989 | Gleason et al. | 324/158 P |
| 4,868,068 | 9/1989 | Yamaguchi et al. | 428/596 |
| 4,936,950 | 6/1990 | Doan et al. | 156/643 |
| 4,983,250 | 1/1991 | Pan | 156/628 |

FOREIGN PATENT DOCUMENTS

| | | |
|---|---|---|
| 259162 | 3/1988 | European Pat. Off. |
| 259163 | 3/1988 | European Pat. Off. |
| 53-76757 | 7/1978 | Japan |
| 1-285946 | 11/1989 | Japan |

OTHER PUBLICATIONS

Wafer Scale Integration—Historical Perspective, N. R. Strader et al., (date unkown).
Solid State Technology, May 1989, Jay Glanville, "Focused Ion Beam Technology for IC Modification", pp. 270–272.

*Primary Examiner*—Carl J. Arbes
*Attorney, Agent, or Firm*—Skjerven, Morrill, MacPherson, Franklin & Friel

[57] ABSTRACT

Each transistor or logic unit on an integrated circuit wafer is tested prior to interconnect metallization. By means of CAD software, the transistor or logic units placement net list is revised to substitute redundant defect-free logic units for defective ones. Then the interconnect metallization is laid down and patterned under control of a CAD computer system. Each die in the wafer thus has its own interconnect scheme, although each die is functionally equivalent, and yields are much higher than with conventional testing at the completed circuit level.

The individual transistor or logic unit testing is accomplished by a specially fabricated flexible tester surface made in one embodiment of several layers of flexible silicon dioxide, each layer containing vias and conductive traces leading to thousands of microscopic metal probe points on one side of the test surface. The probe points electrically contact the contacts on the wafer under test by fluid pressure.

13 Claims, 32 Drawing Sheets

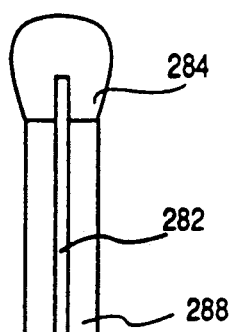
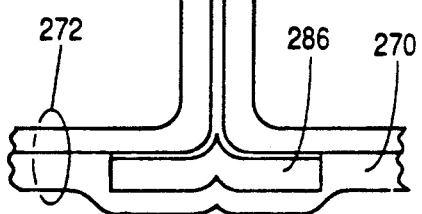
FIG. 17b
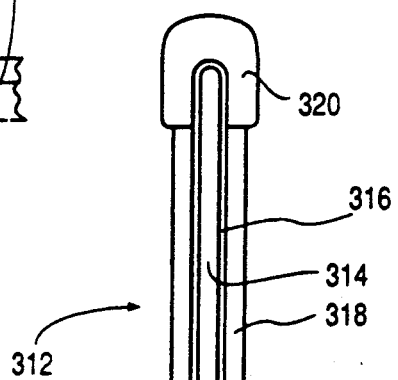
FIG. 18
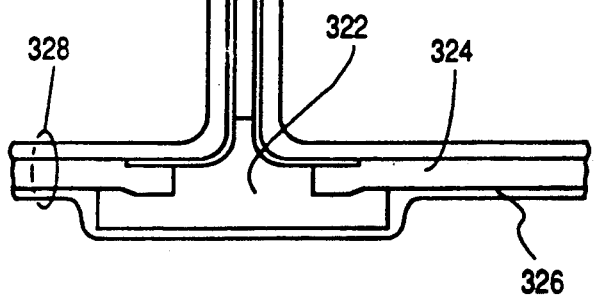

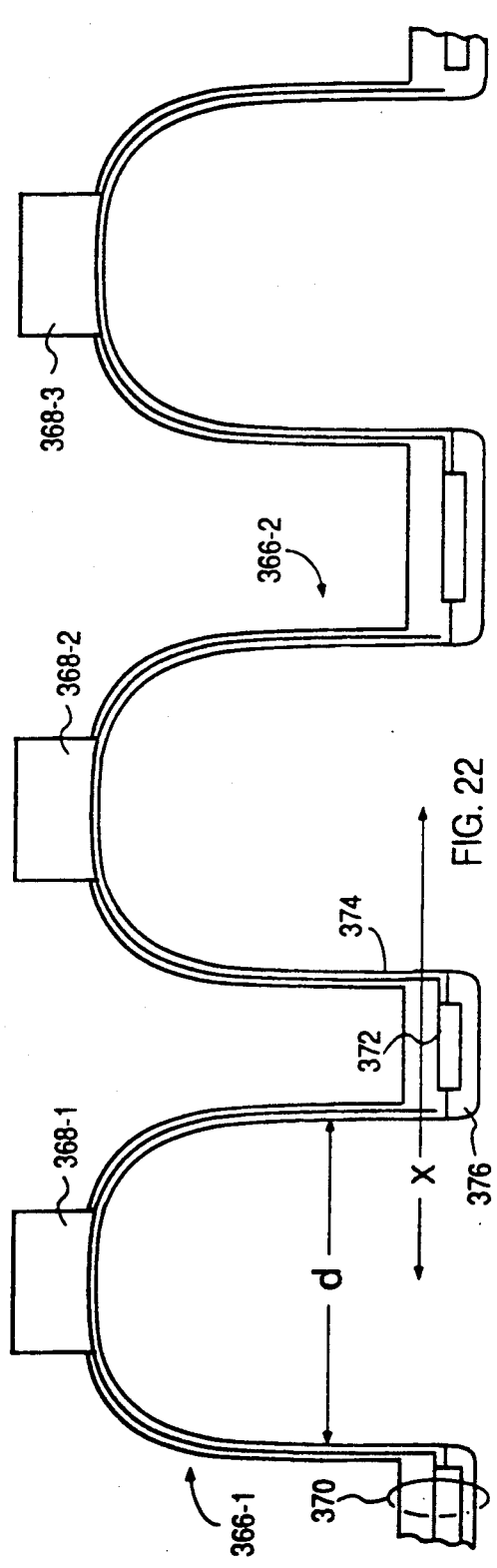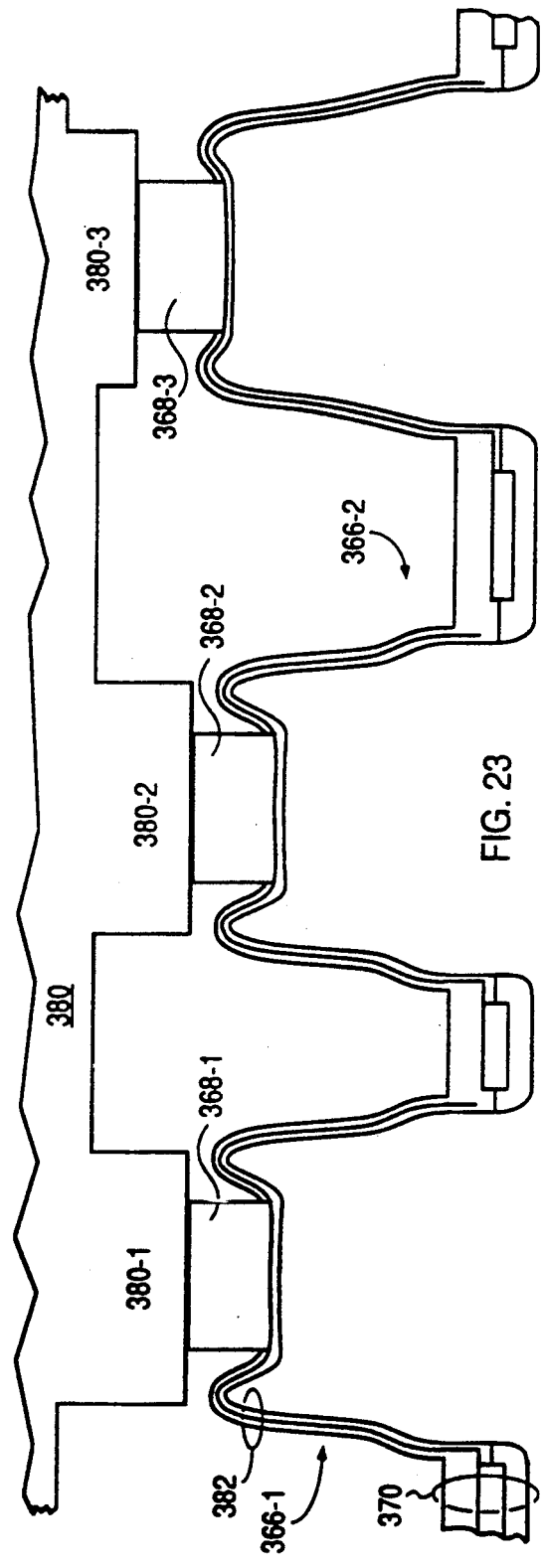

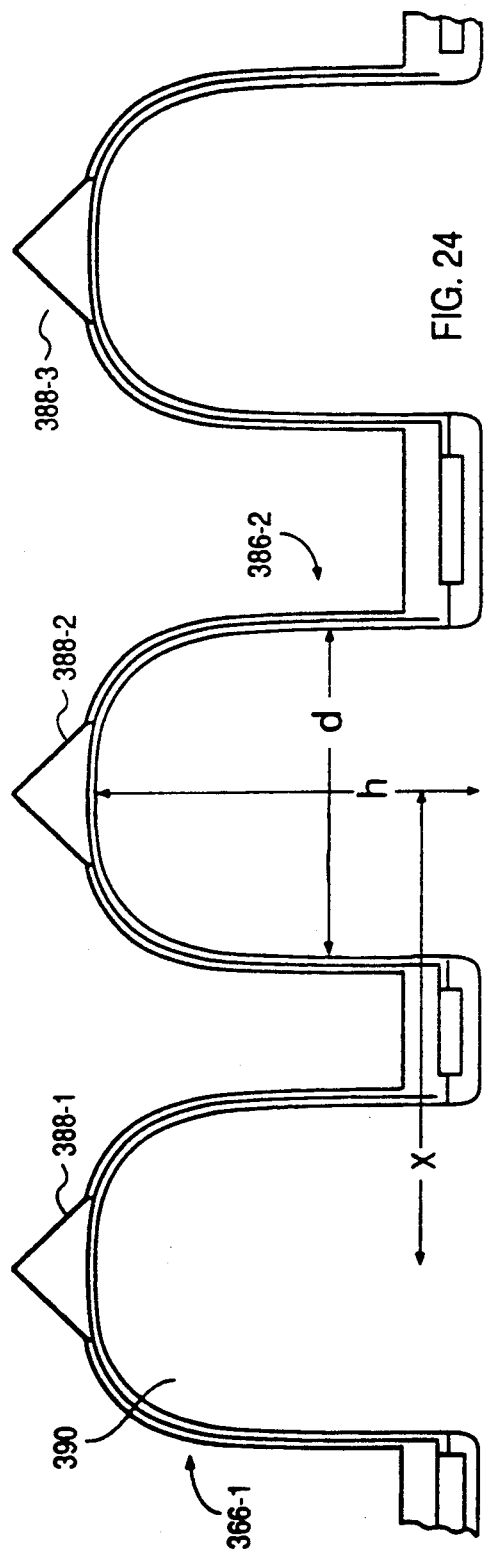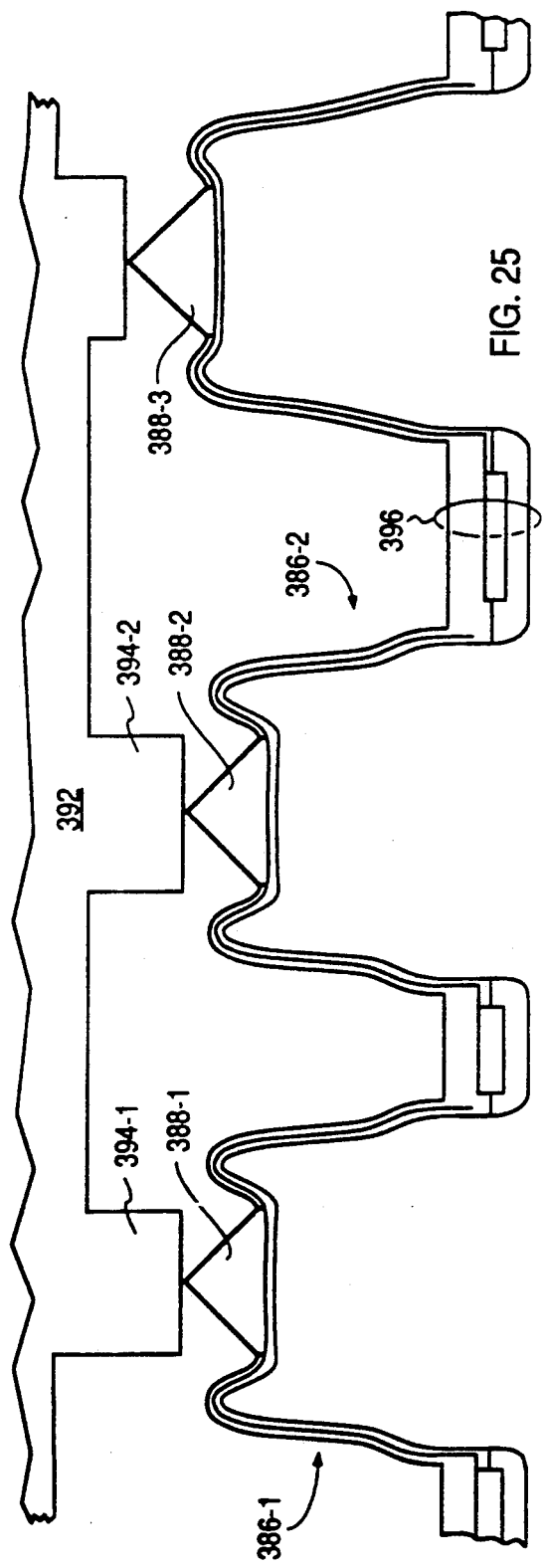

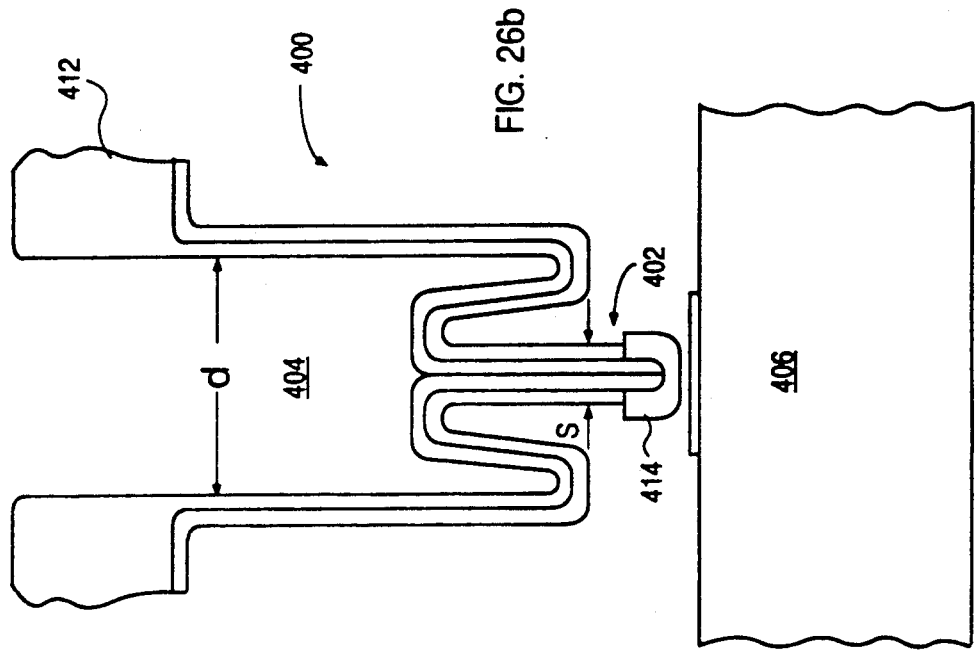
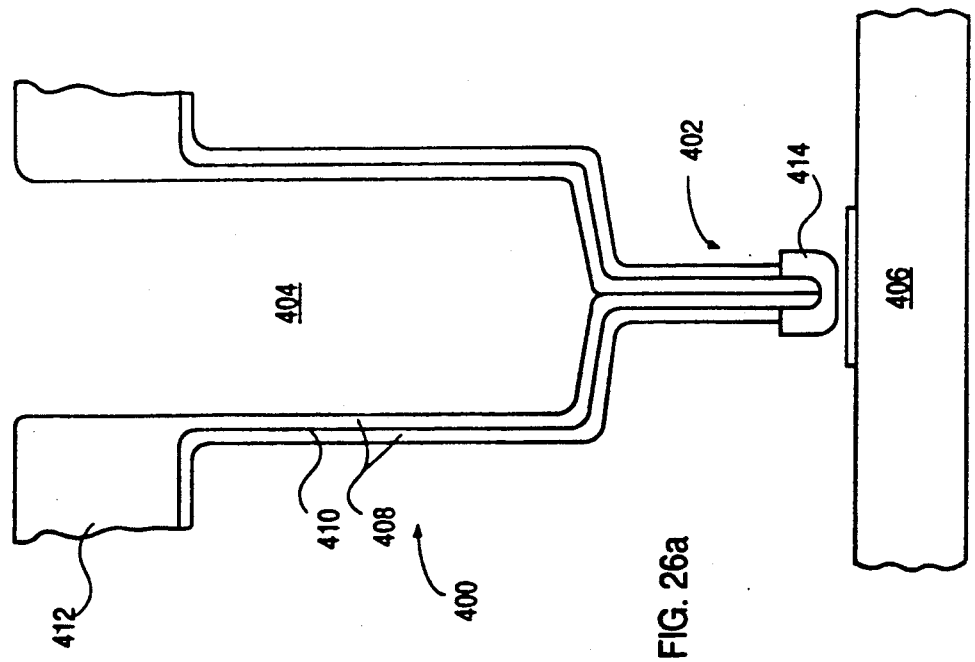

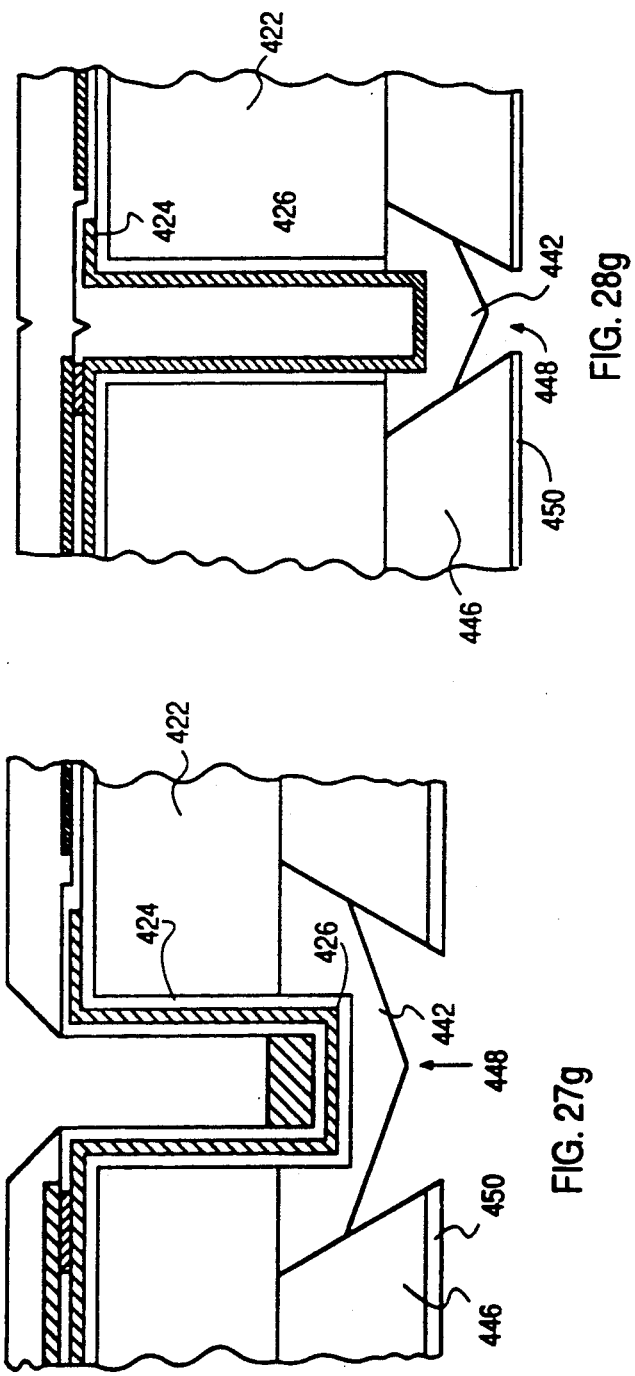

MAKING AND TESTING AN INTEGRATED CIRCUIT USING HIGH DENSITY PROBE POINTS

CROSS REFERENCE TO PRIOR APPLICATION

This is a continuation-in-part application of U.S. patent application Ser. No. 07/194,596, filed May 16, 1988 issued as U.S. Pat. No. 4,924,589 issued May 15, 1990.

BACKGROUND OF THE INVENTION

1. Field of the Invention

This invention relates to a method of making and testing integrated circuits, and a device used to perform such testing.

2. Description of the Prior Art

Integrated circuits (ICs) comprise active and passive elements such as transistors, diodes, resistors, and capacitors, that are interconnected in a predetermined pattern to perform desired functions. The interconnections are effectuated by means of metallization layers and vias. A "via" is a hole through an insulation layer in which conductor material is located to electrically interconnect one conductive layer to another or to an active or passive region in the underlying semiconductor substrate. Present day technology generally employs two metallization layers that are superimposed over the semiconductor wafer structure. Integrated circuits and assemblies have become more complex with time and in a logic circuit, the number of integrated circuit logic units (ICLUs) and interconnects on a given size die have been substantially increased reflecting improved semiconductor processing technology. An ICLU can be a device (such as a transistor), a gate (several transistors) or as many as 25 or more transistors and other devices. As is well known in the art, these conductive contact points have a typical center-to-center spacing of about 6 to 15 microns ($\mu$m).

Standard processing to make logic structures (e.g., gate arrays) includes first fabricating as many as half a million transistors comprising a quarter of a million gates per die. Each semiconductor wafer (typically silicon but sometimes of other material such as gallium arsenide) includes many die, for example, several hundred. In one type of gate array, for example, the transistors are arrayed in rows and columns on each die, and each transistor is provided with conductive contact points (typically metal but sometimes formed of other conductive material such as polycrystalline silicon), also arrayed in rows and columns.

In the prior art, the next step is to use fixed masks to fabricate the conductive layers (sometimes called "metallization layers"), to connect together the individual gate-array devices. Typically two or sometimes three metallization layers are used.

After this, the completed die is tested. If any of the devices on the die are defective, that die will fail an exhaustive test and be scrapped. Therefore, the more transistors per die the lower the manufacturing yield. In some cases redundant sections of a circuit are provided that can be substituted for defective sections of a circuit by fuses after metallization. Typically such redundant sections can be 5% to 10% of the total circuit.

SUMMARY OF THE INVENTION

An object of this invention is to provide an improved test procedure for integrated circuits to increase production yields, by testing a circuit at the ICLU level (hereinafter called "fine grain testing"), compared to conventional testing at the functional IC or die level.

Another object is to permit the fabrication of very large integrated circuits, in terms of the number of ICLUs or devices per circuit.

The present invention improves on prior art by testing each ICLU prior to metallization. Redundant ICLUs are provided on the die to substitute for those found to have defects. Then the metallization layers are fabricated so as to exclude defective ICLUs and substitute good ones from the redundant group and render the circuit operable. The present invention uses a fine grain testing approach, by testing at a low level of complexity.

One key to the present invention is a specially fabricated flexible test means made of flexible silicon dioxide in one embodiment and including multi-layer metal interconnects and microscopic test points. The flexible tester means includes a tester surface, connected to test equipment, that permits testing of each device. Then by CAD (computer aided design) means, each die is metallized and the metal layer is patterned by suitable means, such as E-beam and Ion-Beam processing, to fabricate discretionary metallization interconnect layers of individual gate array devices.

The tester surface is formed on a standard silicon wafer typically by means of a low stress chemical vapor deposition process. The tester surface includes its own metallization layers. On one side of the tester surface are thousands of probe points to contact the contact points on the wafer under test. The tester surface is a special flexible form of silicon dioxide which can be pressed flexibly against the wafer under test to achieve good electrical contact.

By eliminating defects at the device level, process yield is vastly increased — for example to about 90% regardless of die size, in contrast to much lower yields using prior art technology. The present invention also allows successful fabrication of very large die compared to conventional technology.

BRIEF DESCRIPTION OF THE DRAWING

FIGS. 17(b) to 26 show various probe point structures.

FIGS. 27(a) to 27(h), 28(a) to 28(h), and 29 show fabrication of probe points.

Figure 1A:
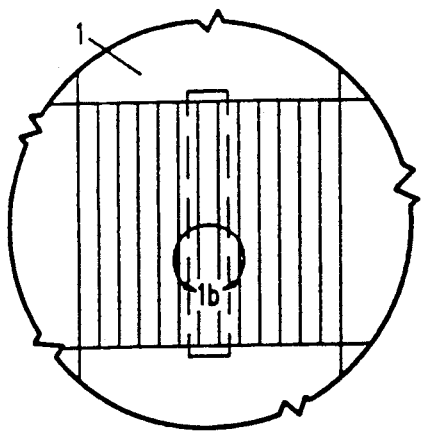
FIG. 1 shows a section of a gate array wafer and the device contacts.

Each reference numeral when used in more than one Figure refers to the same or a similar structure.

DETAILED DESCRIPTION

As state above, the prior art fabricates a plurality of transistors on a die, interconnects the transistors to form desired logic, tests the entire die, and scraps the die if the logic doesn't work. In the present invention, after fabricating the transistors exactly as before, the transistors or ICLUs are tested individually. Then the interconnect scheme is modified, if necessary, by CAD means (of well known design) to bypass defective transistors or ICLUs and substitute, logically speaking, replacement ICLUs. Then the metallization layers are deposited, and patterned in accordance with the modified interconnect scheme typically by E-beam (Electron-beam) lithography, instead of the masking process of the usual conventional technology. Thus each die has its own unique interconnect scheme, even though each die is to carry out the same function as the other die.

Figure 1B:
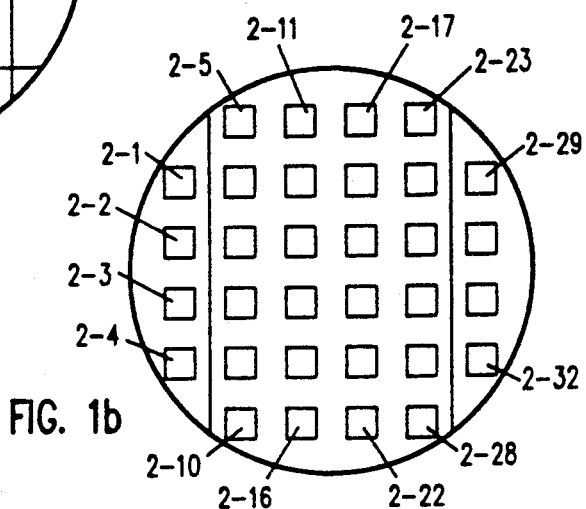

The present invention in one embodiment begins with a gate array conventionally fabricated on a silicon or GaAs wafer. The gate array transistors are arrayed in columns and rows on the wafer surface 1, and the active regions of each transistor are provided with contact points such as 2-1 to 2-32 which are in columns and rows also as shown in FIG. 1 (not all contact points are numbered). Redundant (or extra) devices are designed into each column, with a redundancy factor dependent on the expected yield of the individual transistors or ICLUs being tested.

The surface of the wafer 1 is optionally planarized with a cured layer of polymide 0.8 to 1.5 micron thick if the step heights between contact points are greater than 0.5 microns. (The contact points 2-1 to 2-32 are masked from the polymide layer, to create a via over each contact point free of polymide, and metal is deposited to fill the via.)

The fabricated (but not metallized) wafer 1 is now ready for testing. In the described embodiment, only one column of transistors on each die is tested at a time, although testing more than one column per step is possible. For a die of typical complexity this requires making contact with all of the perhaps 10,000 or so contact points such as 2-1 to 2-4 in one column simultaneously, and then stepping across all 100 or 200 or more columns in each die, to totally test each die in step-and-repeat fashion. Each contact point such as 2-1 is small — usually 4×4 microns. Each wafer contains a plurality of die, the exact number depending on the size of the wafer but typically being in the hundreds.

Figure 2:
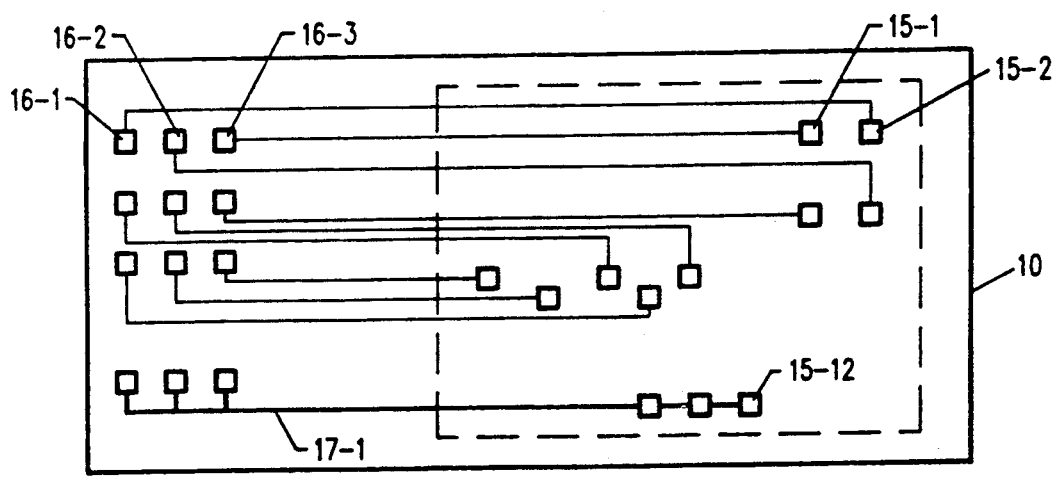
FIGS. 2–3 show a top and side view of part of the tester surface.
Figure 3:
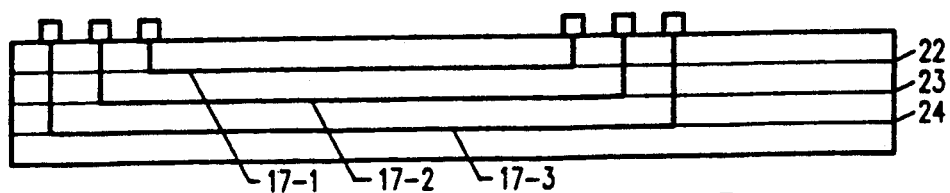
Figure 4B:
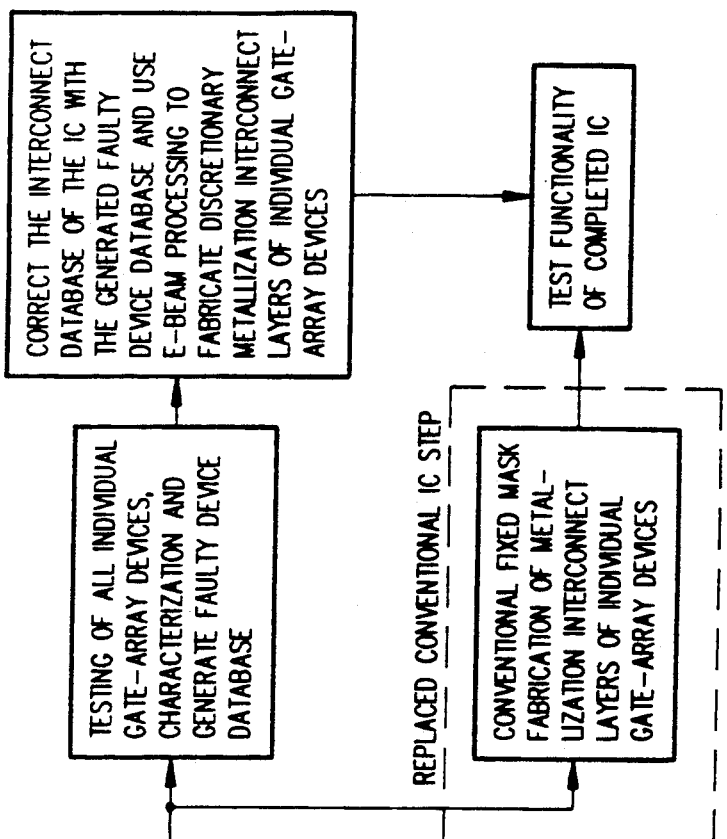
FIGS. 4(a) and 4(b) show the test procedure.
Figure 4A:
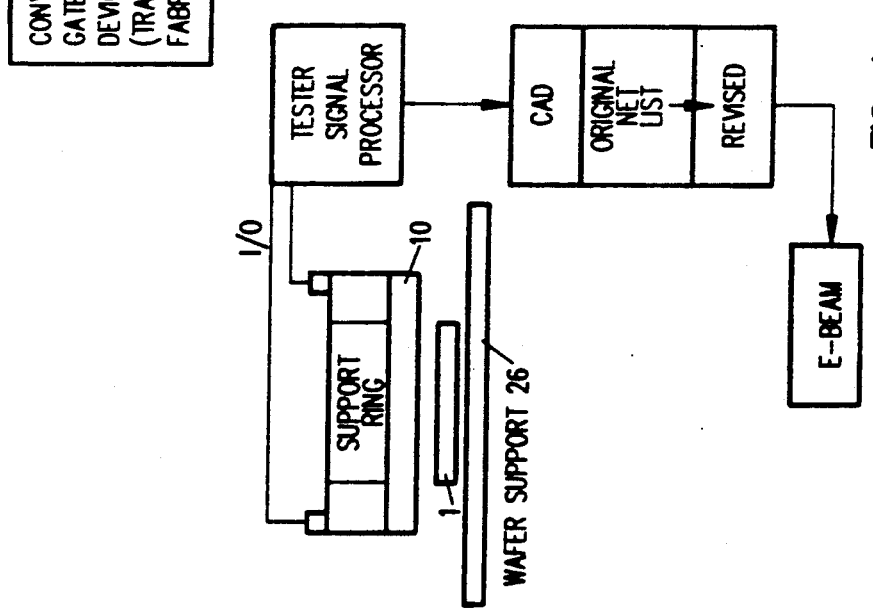

The flexible tester of this invention includes a tester surface 10 (described in detail below) as seen in FIG. 2 which includes a series of tester surface contact points including 15-1, 15-2 (which are arranged to contact on a one-to-one basis the corresponding contact points in a column on the die under test) and a complete wiring interconnection, including a testing array which includes contacts 16-1, 16-2 and 16-3 and interconnect pathways 17-1, 17-2 and 17-3 as seen in FIG. 3, at various levels 22, 23, 24 in the tester surface. The tester array which includes contacts 16-1, 16-2 and 16-3 connects to a conventional tester signal processor as shown in FIG. 4a having line driver logic circuits for accessing serially or in parallel the devices under test. The driver logic signals are programmed separately in a well known manner and are multiplexed between testing array contacts 16, providing programmable input/output means for supplying diagnostic signals to the transistors or ICLUs under test. Therefore, all the wafer contact points in one column can be accessed in one physical contact step of the transistors or devices to be tested.

The wafer 1 under test and the tester surface 10 are disposed on a support 26, as shown schematically in FIG. 4(a), for test purposes, to electrically connect the contact points on the tester surface 10 and corresponding contact points on the wafer 1. FIG. 4(b) shows the test procedure in process-flow format. A fluid well or bladder (not shown) is used to exert an uniform pressure over the flexible tester surface 10 (FIG. 4(a)) in order to conform it to the surface of the wafer 1 under test and to ensure that the numerous corresponding contact points on the tester surface 10 and the wafer 1 come together and make firm electrical contact. This is possible due to the fact that the surface of the wafer 1 under test typically has a controlled total runout flatness within 6 to 10 microns across its complete surface. Secondly, the tester surface 10 is less than 15 microns thick and typically 1.5 microns thick and of a very flexible material, such as low stress silicon dioxide. Thirdly, the metal contact points are the highest raised surface features on either the tester surface 10 or the surface of the wafer 1 under test, and are of a controlled uniform height typically between 2 and 6 microns.

The wafer 1 under test as shown in FIG. 4(a) is mounted on an x-y motion table (not shown). Movement of the table in the x-y directions positions the wafer for test by alignment of the contact points such as 15-1 and 15-2 of the test surface 10 (FIG. 2) with the corresponding device contact points such as 2-1 and 2-2 of the wafer 1.

Figures 5, 6:
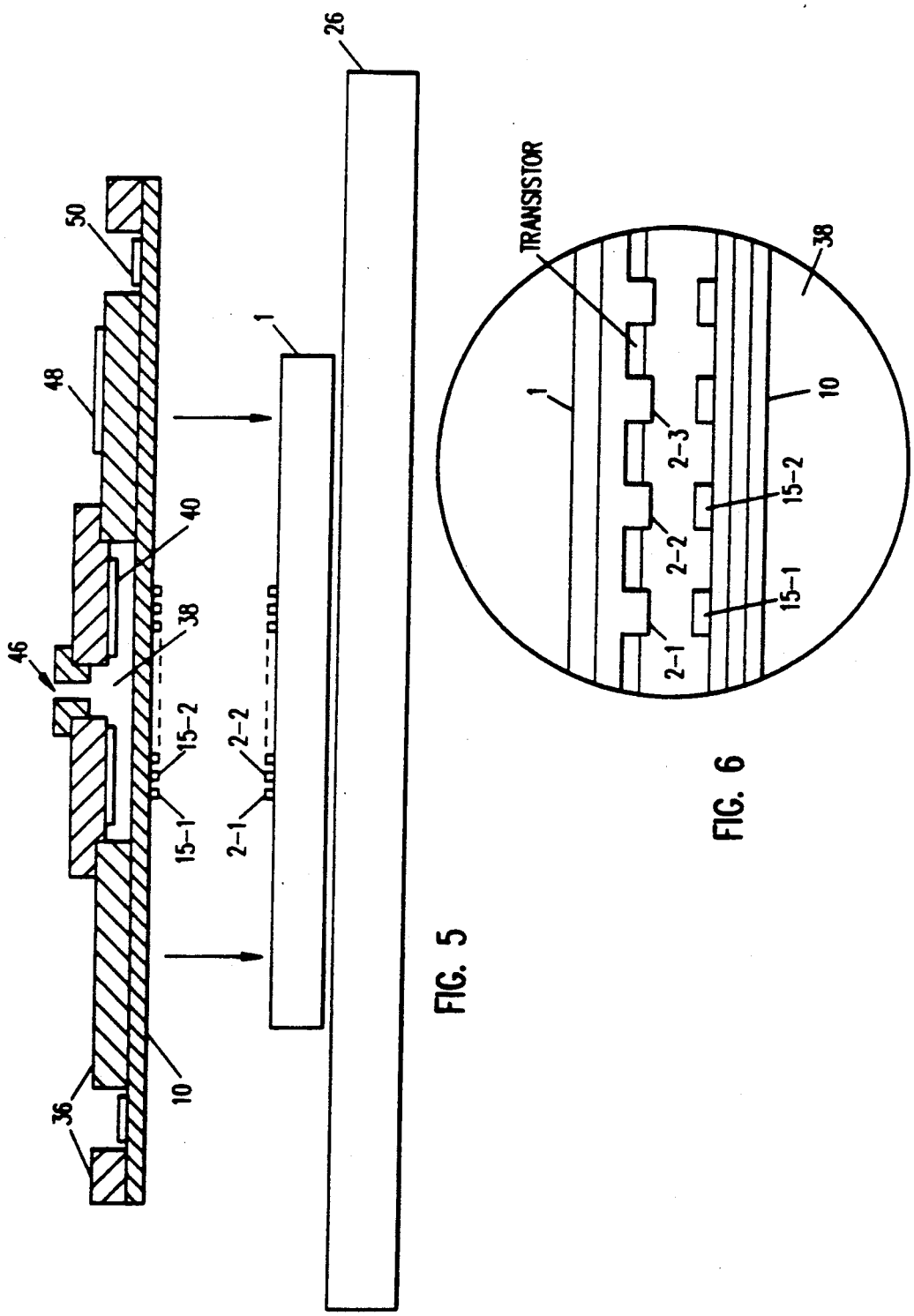
FIG. 5 shows the fluid pressure test assembly.
FIG. 6 shows an exploded view of the wafer and tester surface.

During the test procedure as shown in FIG. 4(a), the wafer 1 under test is retained by suction in a substantially planar fixed position, by means of the support 26 illustrated in FIG. 4(a) and in FIG. 5. Use of suction to hold a wafer in place is well-known. Tester surface 10 is mounted on a support ring 36 (as described below) to provide mechanical support and electrical connections, as shown in FIG. 5. The tester surface 10 is urged uniformly toward the wafer 1 under test by a fluid well or bladder 38 immediately behind tester surface 10. A solenoid (not shown) is provided for macro control of the pressure exerted by the fluid in the fluid well 38 on tester surface 10. The depth of fluid well 38 is less than 100 mils; this is the distance between the back of tester surface, 10 and piezoelectric pressure cell 40.

Piezoelectric pressure cell 40 is a layer of material about five-hundredths of an inch (one millimeter) thick that will expand about one-half micron when voltage is applied to the piezoelectric material. The applied pressure on the back of the tester surface 10 is only a few grams per square centimeter. Piezoelectric pressure cell 40 provides the last increment of pressure on the fluid and in turn on the back of tester surface 10 to achieve good electrical contact between the contact points such as 15-1 and 15-2 on tester surface 10 and the contact points such as 2-1 and 2-2 on wafer 1. The fluid is provided to the assembly through fluid port 46 which is connected to a fluid reservoir (not shown). The support ring 36 includes computer cabling attachment sites 48 and multiplexer circuits 50. The support ring structure is described in more detail below.

As described above, mechanical positioners (i.e., x-y table aligners and conventional mechanical vertical positioners, not shown) bring the wafer 1 to within a few mils of the tester surface 10 and make a first approximation of the alignment of contact points through a conventional optical aligner (not shown). The optical alignment is performed in a manner similar to that used by present semiconductor mask aligners, by using alignment patterns in predetermined positions on both the wafer 1 being tested and the tester surface 10. Only the pressure of the fluid moves the tester surface 10 the one or two mil distance separating the tester surface 10 and the wafer 1 to be tested in order to gain physical contact. FIG. 6 illustrates in an exploded view wafer 1 and tester surface 10 being moved by fluid pressure from fluid well 38 just before wafer contact points such as 2-1 and 2-2 make contact with corresponding tester surface contacts such as 15-1 and 15-2.

In an additional alignment method, a small area (not shown) with a pattern of alignment contact points of various sizes up to 1 mil (25 microns) square and positioned at two or three corresponding alignment sites on both the wafer 1 and the tester surface 10 is then used as an electrical circuit feedback system. The feedback system, starting with the largest contact points at each site and moving progressively to the smallest, determines the accuracy of the alignment and makes appropriate micron sized adjustments under computer control to within sub-micron x-y alignment accuracy.

In the described embodiment, the fluid in the test surface assembly is Florinert from DuPont. Any alternate fluid with similar nonconductive and nonreactive properties could be substituted.

After an entire wafer 1 has been tested, it is removed and another wafer moved into position to be tested.

The data resulting from the tester signal processor is a list of the location of each defective transistors or ICLUs. This list is automatically communicated to the conventional CAD means from the tester signal processor as shown in FIG. 4. The CAD means then, by special software algorithms works out an interconnect strategy for each die. Therefore, the master placement scheme of the net list is modified in terms of the placement of the defective ICLUs so as to bypass the defective ICLUs and interconnect defect-free ICLUs from the stock of redundant ICLUs.

The invention uses two alternative software algorithms: recomputation of metallization trace routing or a CAD rip-up router.

The first alternative is the well-known and commercially available recomputation of the metallization trace routing for all affected layers of a specific IC after it has been tested. The routing is performed automatically with CAD software. This routing procedure requires that sufficient defect-free redundant ICLUs have been allocated in the master placement of ICLUs and that the redundant ICLUs can be routed into the circuit given the potential restrictions that the number of metallization layers may present. The software that precedes this processing performs the entry into a CAD system of the placement net-list change commands that direct the substitution of the defective ICLUs with available redundant ICLUs. These change commands are specific to the CAD system that is selected for use, and the commands issued are similar to those a circuit designer would enter if making an ICLU placement select in a design change when using a gate-array.

This recomputation routing approach makes substantial requirements on computing resources. However, super-minicomputers presently available are sufficient to meet the computational requirements.

The second software alternative, a CAD rip-up router, takes advantage of the knowledge that the defects occurring in current bulk silicon semiconductor processes are few in number and are localized (i.e., the defects only affect one or two ICLUs at any particular defect site), and of the fine grain ICLU structure. The fine grain level of testing minimizes the area necessary for redundant ICLUs and the complexity of the placement and routing changes that must be effected to correct for defective ICLUs. Wafer or large ICs that indicate larger than normal numbers of defects or defects that are large in affected area when tested by testing equipment will cause the wafer to be rejected as outside of the acceptable bulk manufacturing standards which are typical of all existing IC lines. The number of defects to be expected with standard available silicon wafers is approximately five per $cm^2$ currently. This means that approximately five or less ICLUs can be expected to be defective per $cm^2$. The number of defects per $cm^2$ increase as device feature sizes decrease, but not dramatically, as indicated by the current industrial use of 0.8 micron geometries for 4 Megabit memory devices, which will soon be in limited production.

This rip-up router software process approach takes advantage of this wafer ICLU defect density characteristic by employing a CAD rip-up router. This CAD software tool has only become available recently and heretofore was only used during the design phase of a large IC in an effort to conserve designer and computer time. The rip-up router attempts to make local changes to existing IC metallization layout and, therefore, avoiding the expense of recomputing the complete IC's metallization trace routing. The rip-up router is an automatic tool; it accepts change commands to the ICLU placement net-list and then computes changes to the IC's metallization database. This modified IC metallization database is then processed for input to the E-beam lithographic equipment; this processing software is the standard software used to drive the E-beam equipment. The computer processing time required to do local rip-up route changes has been measured and found to be typically 1 to 2 seconds on an inexpensive 32-bit minicomputer.

The modified net list is next used to produce the database for the desired interconnect patterns on the wafer using E-beam means. The metallization process is in one embodiment a two layer metallization, although a single layer of metallization or three or more layers of metallization can also be used. The process involves depositing a layer of insulation, such as silicon dioxide, typically of about one micron thickness over the wafer surface, and cutting vias by means of a mask to the contact points on the wafer surface through the silicon dioxide layer. Then a layer of metal, typically aluminum, is deposited over the silicon dioxide. Then a layer of photoresist is deposited and patterned, for example using E-beam (maskless) lithography. The E-beam is controlled by the CAD database means and its modified net list to make the desired interconnect pattern corrected in accordance with the test results. The photoresist is then developed and removed where not exposed to the E-beam, allowing the patterning of the interconnects as desired.

The metallization process is then repeated for the second metallization layer and any subsequent metallization layers. The metallization process is generally well known technology, the innovation being that the net list is modified for each die even though the function to be implemented on each die is identical.

At this point the wafer is complete, ready for scribing, packaging and final test as usual.

The tester surface as mentioned above is a key element of this invention.

Figure 7:
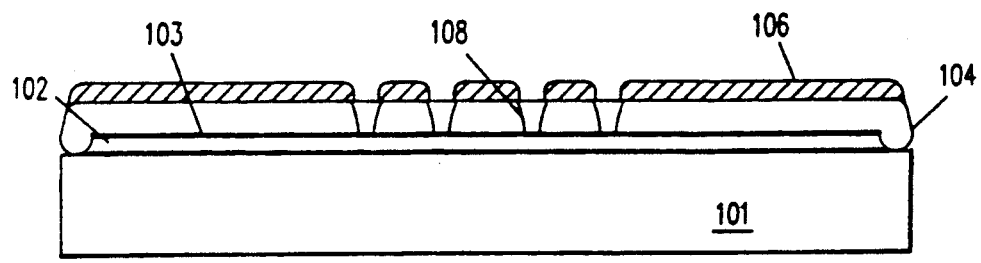
FIGS. 7-12 show the steps to fabricate the tester surface.
Figure 8:
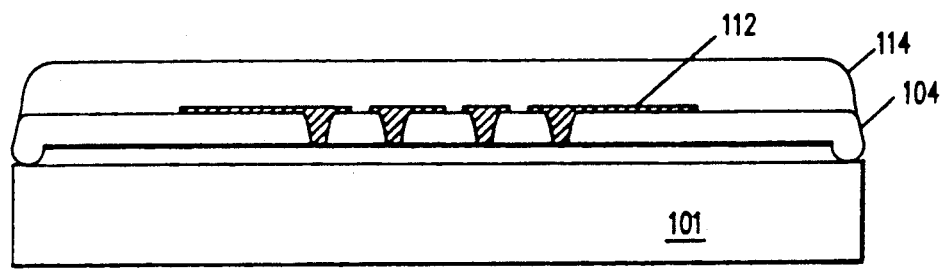

The tester surface is specially fabricated using advanced semiconductor manufacturing methods. Starting as shown in FIG. 7 with typically a conventional 5" or 6" silicon wafer substrate 101 (without any circuitry on it), a layer of KBr or other release agent 102 is deposited over the wafer 101 surface, followed by a layer of gold 103 about 1000Å (0.1 micron) thick. Then a layer of silicon dioxide 104 of about one micron thickness is deposited on the wafer 101 surface by means of chemical vapor deposition. This is a low stress layer, deposited at about 100° F., using commercially available systems such as provided by Ionic Systems (Milpitas, CA) or ASM Lithography, Inc. (Tempe, AZ). The silicon dioxide layer 104 has a surface stress of about $10^5$ dynes/cm$^2$, making it very flexible. Then, using conventional mask methods and photoresist layer 106 as described above, vias such as 108 are etched, down to the gold layer, in the silicon dioxide layer 104 to define the probe points. The vias such as 108 are 2 to 4 microns in diameter.

The tester surface, in the preferred embodiment, has two similar gold metallization layers on top of the wafer. The first metallization layer is formed by first depositing, over the KBr layer 102, a silicide layer (not shown) 1000Å to 2000Å (0.1 to 0.2 microns) thick to act as an etch stop. Then the silicide deposition is removed from all but the vias 108. A nichrome/gold metallization-I layer 112 is deposited, to a thickness of 1000Å to 2000Å, and a first layer metal mask and etch are used to define the interconnect lines by forming traces.

Figure 9:
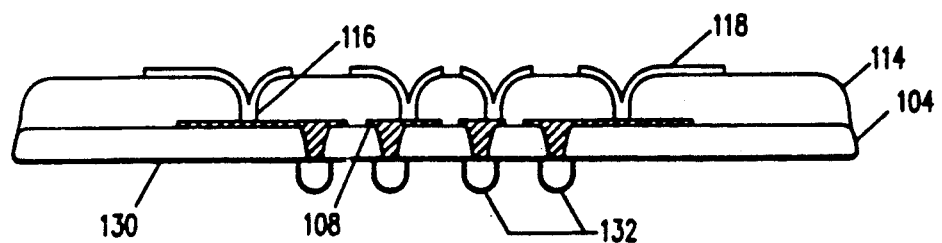

Then a second silicon dioxide layer 114, also about one micron thick, is deposited, followed by the second layer via 116 masking, second layer via etching, nichrome/gold metallization layer-II 118 and second layer metal mask and etch as shown in FIG. 9.

Figure 10:
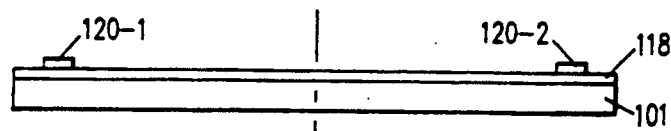

Next, customized multiplexer circuits such as 120-1 and 120-2 as shown in side view in FIG. 10 are attached to the metallization-II layer 118. These multiplexers 120-1 and 120-2 are individual die that contact the metallization-II layer 118 traces as desired, to provide electrical connections to the tester signal processor. The multiplexers such as 120-1 and 120-2 are dispersed around the outer part of the metallization-II layer 118 on the wafer 101, and serve as programmable input/output means.

Figure 11:
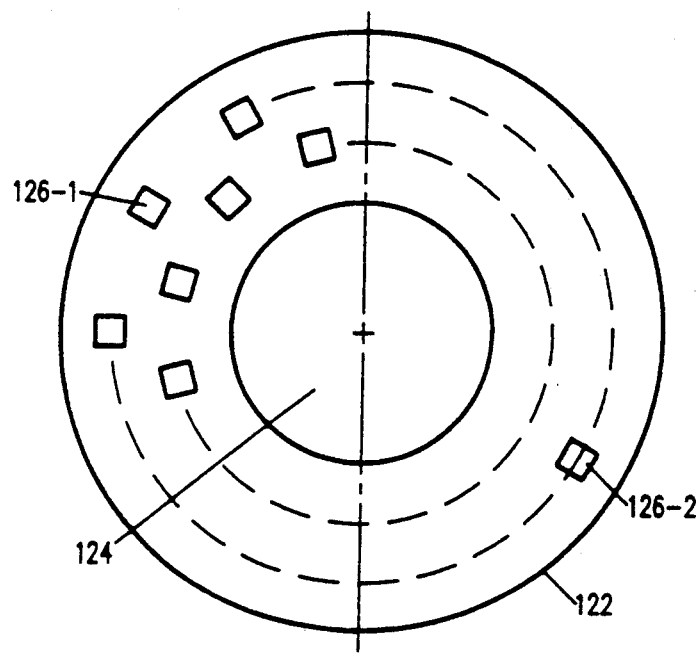
Figure 12:
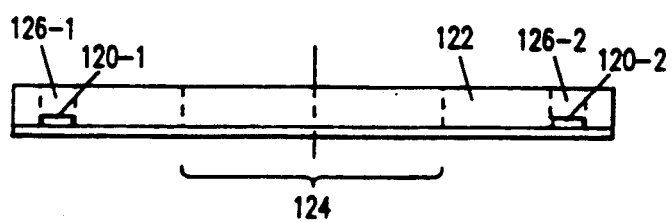

Next a mechanical structure called a support ring 122, as shown in top view in FIG. 11, and in side view in FIG. 12, is bonded with epoxy adhesive to the metallization-II layer 118 on top of the wafer 101. The support ring 122 is typically a quartz annulus (ring) of the same outer diameter as the wafer substrate 101 and an inner diameter of 1 to 2 inches.

The quartz support ring 122 is in one embodiment 0.1 inch thick. Its inner area 124 is the contact area of the test surface. The ring 122 thus supports the actual contact area 124 and provides electrical connections to the remainder of the test system. The support ring 122 has holes such as 126-1 and 126-2 (FIG. 11, 12) machined into it to accommodate the multiplexer circuits including 120-1 and 120-2 as shown in FIG. 12.

The support ring 122 and its underlying silicon dioxide and metal layers are now released from the underlying silicon wafer 101 shown in FIG. 9. The release agent KBr (or similar material) was the material first deposited on the wafer 101. By means of the release agent, scribing around the edge of the support ring and then dipping the assembly shown in FIG. 12 in water allows the silicon dioxide layers to be peeled off the wafer 101. Alternatively, without the use of KBr, release can be achieved by etching the wafer 101 away in an ethylene-diamine solution Next, with the tester surface free of the wafer 101, the first gold deposition layer 103 shown in FIG. 7 is stripped off, leaving the exposed gold-filled vias such as 108 on the released surface 130 as shown in FIG. 9.

To complete the tester surface, probe points are grown on the released surface, so that the probe points grow out from the vias such as 108. To grow the probe points, the support ring 122 and its attached layers are put in a float not shown), and the float placed in an electrolytic solution containing gold with the exposed ends of the vias 108 as shown in FIG. 9 immersed in the solution. Voltage is applied and the probe points such as 132 grow by electrolyzation at the ends of the vias 108.

The probe points such as 132 are thus made of gold in the preferred embodiment and grow out of the central part 124 of the test surface as shown in FIG. 12. The probe points such as 132 are 2 to 4 microns in diameter, and about 4 microns high. They connect with the metal in each via, and hence to the two metallization layers. The pattern of probe points such as 132 on the tester surface is unique, and corresponds to the contact test points on the wafer to be tested.

Several kinds of probe points 132 can be provided. In an alternative embodiment, probe point height is determined by a mask. To provide masked probe points, a mask containing vias is formed on surface 130 at the probe point locations, then the points grown in the vias and then the mask removed. The probe points can be aluminum or other suitable metals or conductive materials.

The tester surface itself can be fabricated with elastomeric probe points such as conductive doped polyacetylene (personal contact with Professor Alan G. MacDiarmid, University of Pennsylvania and also see "Plastics that Conduct Electricity," *Scientific American*, Feb., 1988, pgs. 106–111, by Richard B. Kaner and Alan G. MacDiarmid) that compress on contact with the contact points of the device or ICLU under test, to allow closer probe point spacing or to make the tester surface more flexible. Such elastomeric materials are applied and etched with established techniques.

In a slightly different method to fabricate the tester surface, the substrate wafer first has etched in its center a circular depression one to two inches in diameter and typically twenty mils deep. This depression will impart a gradual extension to the outer part of the tester surface, so that the center part of the finished surface will extend slightly below the surrounding tester surface.

Figure 13:
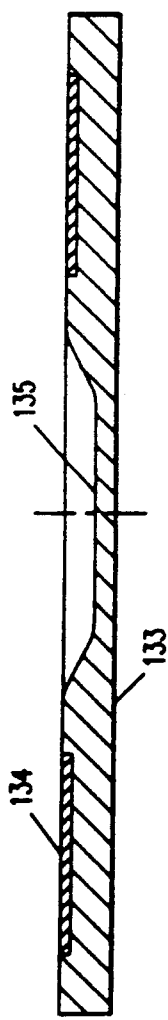
FIGS. 13-15 show the steps to fabricate another embodiment of the tester surface.
Figure 14:
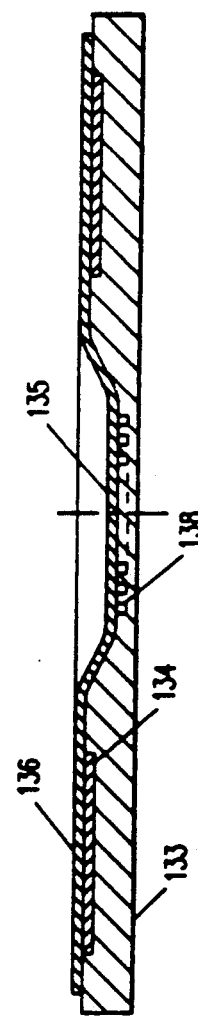
Figure 15:
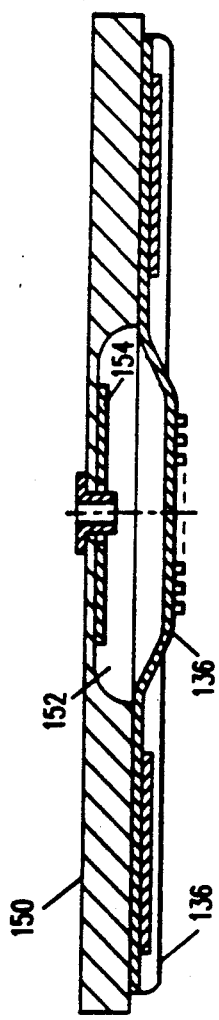

A different tester surface is illustrated in FIGS. 13–15. Here the multiplexer circuits and tester logic are integrated into the tester surface. FIG. 13 shows how, as before, starting with a standard semiconductor wafer 133, multiplexer and tester logic circuitry 134 is fabricated on the surface of wafer 133. Then, as described above, a depression 135 is etched in the center of wafer 133. The depression 135 is again one to two inches in diameter and typically twenty mils deep. Then, as shown in FIG. 14, several layers of silicon dioxide and metallization 136 are formed on the wafer over depression 135 and over the logic sites 134. In this embodiment, the tester probe point array sites such as 138 may (optionally) be etched into the surface of the wafer 133 in the depression, to allow preformation of the probe points by filling the etched probe point sites 138 with metallization.

After the tester surface 136 (FIG. 14) is fully fabricated on wafer 133, the surface 136 is separated from wafer 133 as before by selective etching away of wafer 133. (Release agents cannot be used here since part of wafer 133 including logic sites 134 must remain as part of tester surface 136). The tester surface 136 is attached to a support ring 150 before the step of selective etching as shown in FIG. 15, and used in the same manner as described above with a fluid well 152 and piezoelectric pressure cell 154 provided.

Depending on their shape and material, the probe points such as 132 in the various embodiments will exhibit mechanical wear when in use to probe the wafer under test. When worn below tolerance, the points can be refurbished by dipping in aqua regia to remove them, and then renewed with the electrolyzation process as before, to produce a remanufactured surface.

Figure 16:
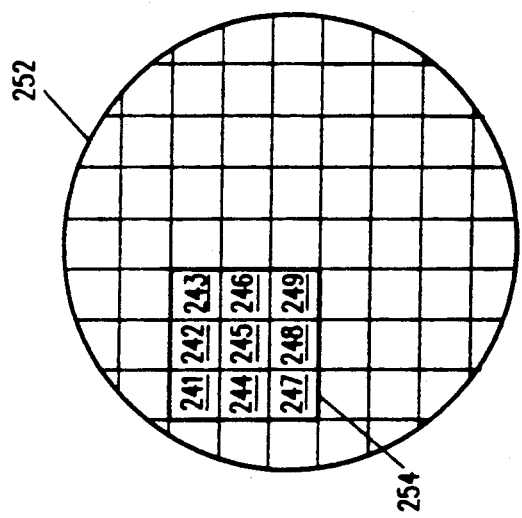
FIG. 16 shows how nine die can form one super die.

The above description of embodiments of this invention is intended to be illustrative and not limiting. For instance, very large circuits can be produced by testing and metallizing nine adjacent die 240 to 249 (in a 3×3 array) on a wafer 252 as shown in FIG. 16, and then interconnecting the nine die to form one super die 254.

Alternatively, the invention can be practiced not only at the transistor level, but at the ICLU level such as a standard gate or custom gates or memory devices. This involves fewer contact points, and requires redundancy to be provided in the form of extra gates or groups of gates to replaced defective ICLUs. The invention is also not restricted to gate arrays, and could be practiced on any kind of integrated circuit (e.g., custom logic or DRAM).

If the tester surface probe points are enlarged to sizes of 2×2 mils to 4×4 mils, the tester surface would have an additional utility as a functional circuit tester for die-sorting purposes after the manufacturing of the circuit is completed. This application would increase pin count density over the prior art.

The tester surface can be fabricated from flexible materials other than silicon dioxide, such as silicon nitride or polymers, so long as the materials physically support vias and conductive traces.

In another embodiment, the tester interconnections are formed on the surface of the wafer to be tested.

In this embodiment, instead of fabricating a tester surface of N×M test points in a grid with an interconnecting set of metallization layers fabricated in the tester surface, the interconnection metallization is fabricated on the surface of the wafer (forming direct metallization contact to the ICLU contact points) and the probe points are arranged as a ring around this on-wafer tester interconnect structure. This process would form the same electrical connection path to the ICLUs to be tested as in the previously described embodiments. The advantage here is that much smaller ICLU or contact points could be accessed, or alternatively this embodiment allows wider spacing of tester surface probe points and requires fewer of them, i.e. only N+M points. This embodiment greatly increases the potential operable range of the invention with only a small increase in processing costs for the on-wafer metallization structure. The on-wafer metallization structure is temporary.

It is fabricated out of a metal such as aluminum and a separation dielectric layer of resist. Once the on-wafer interconnect structure has been used to test the ICLUs or devices by the tester surface, the interconnect structure is etched from the surface of the wafer by normal wafer cleaning methods.

Probe Point Structure and Fabrication

In accordance with the invention, the diameter of the probe points varies from several mils to less than a micron. The larger probe points are typically used in the construction of functional IC testers where the electrode contact or pad size on the IC to be tested is typically 2 mils to 5 mils in diameter. Use of the method in the construction of a functional IC tester allows 1 mil or less pad size diameter.

The various embodiments of the probe point design provide a vertical probe point contact adjustment of approximately 10% to 40% of the length of the probe point. This adjustment is provided due to the well-known flexibility of the low stress silicon dioxide ($SiO_2$) material in the probe point or the elastomeric properties of various conductive polymers such as polyacetylene, polythiophene or polypyrrole as examples. Thus these embodiments of the probe point are flexible structures which recover to their original shape after being flexed. In one embodiment of the invention, flexibility of certain probe points allows the use of such probe points in a tester surface without the need for fluid back pressure as described above.

The adjustable probe point structure is applicable to both large probe point applications such as a functional IC wafer sorter system and for the manufacturing of large scale integrated circuits as practiced in accordance with the invention. The adjustable probe points in use can be located on the tester surface at a very small center-to-center spacing (e.g., approximately 1.5 times to twice the diameter of the probe point's largest dimension) and thereby may contact pad sizes on the device to be tested of the diameter of approximately 0.5 micrometer or less with center-to-center contact pad separation of 1 $\mu$m or less. In other embodiments, the probe points have a diameter of approximately 0.25 micrometers. The probe point structure is scalable in accordance with CVD (chemical vapor deposition) process, electroplating processes, and lithographic technology limitations, and therefore the fabrication of probe points as described below with diameters less than 0.1 $\mu$m is supported.

In use, each probe point engages in a wiping action so as to engage and electrically contact the contact pads (electrodes) of the circuit device under test. The wiping action of the probe point at the contact pad of the device under test is necessary to achieve ohmic contact when contact pads are made from metals that form overlying thin films of native oxides such as aluminum. The wiping action breaks through the thin film of native oxide overlaying the contact pad. This wiping action is accomplished through mechanical vibration of the tester fluid which is provided behind the silicon dioxide supporting membrane. In the embodiment where the tester surface is without a fluid providing backpressure, a 5 micron to ten mil thick layer of a conductive elastomeric polymer, such as conductively doped polyacetylene, is formed over a piezoelectric material layer on the side directly opposite the probe points of the tester surface. The elastomeric material absorbs shear stress experienced by the tester surface brought about by loading during contact of the DUT and piezoelectric generated wiping action. The piezoelectric material is then made to vibrate by supplying it with an electrical voltage of a desired frequency, which in turn causes a wiping action of the tip of the probe point on the surface of the substrate being tested.

In accordance with the invention also, a voltage input frequency to the piezoelectric material controlling the probe point pressure is used to cause a wiping action of the probe point tip. The appropriate voltage frequency results in vibration of the piezoelectric material which in turn is transmitted to the probe points through the fluid in the bladder.

Figure 17A:
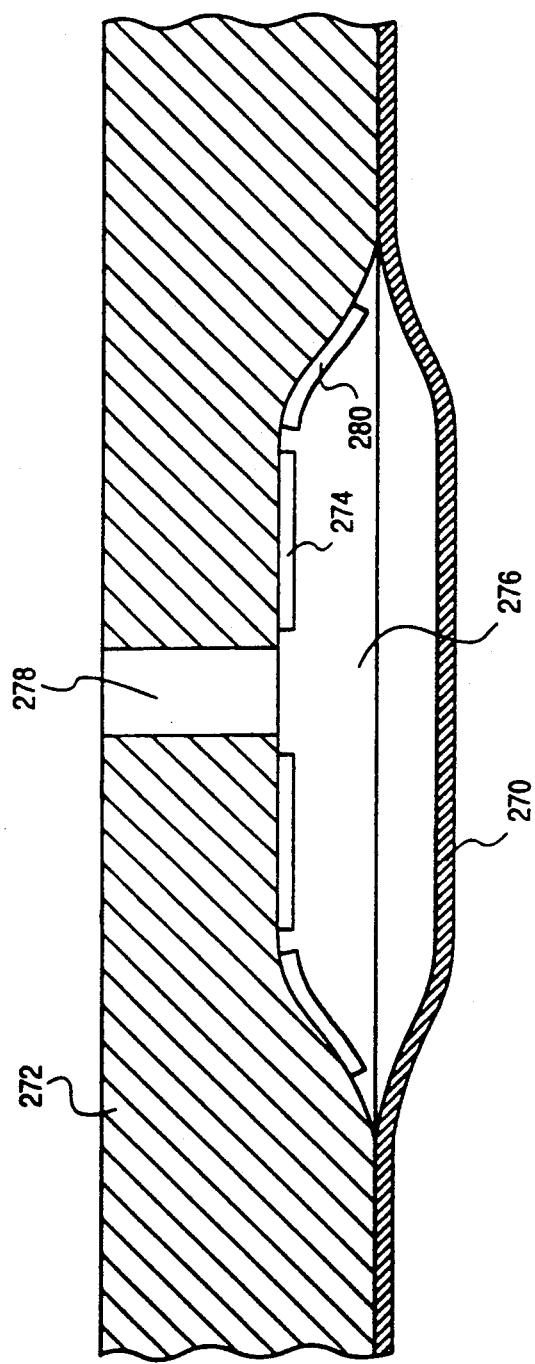
FIG. 17(a) shows a tester surface.

An additional layer of piezoelectric material, adjacent to the first layer but separated from the first layer by approximately 50 mils is used to measure the applied force on the tester surface. This optional piezoelectric layer generates a small voltage when mechanical stresses are applied to it. These voltages are read and converted to load equivalent measurements on the tester's surface. These measurements are used to determine an over-load pressure on the tester surfaces as shown in cross-section view of tester surface and support plate, FIG. 17(a). FIG. 17(a) shows in cross-section the tester surface membrane 270 and support plate 272 with the use of a piezoelectric material 274 as a pressure sensor in the fluid-filled bladder 276 of the tester surface. The fluid port 278 and piezoelectric generator 280 are also shown.

The physical placement orientation of the tester may be below (i.e., underneath) the DUT substrate. This would prevent any downward distortion of tester surface membrane 270 from the fluid 276 behind the membrane 270 due to gravity. Instead the positions of tester surface 270 and the DUT substrate (not shown) are in reverse order from what one would intuitively expect, or the DUT substrate is held over tester surface 270 and tester surface 270 is raised to make contact with the DUT. In this manner it is easier for tester surface 270 to maintain its originally formed shape while under internal fluid pressure. Incremental mechanical vertical adjustment means will be sufficient in many applications to bring all the probe points (not shown) of the tester surface into full contact with the DUT without resorting to the application of additional piezoelectric generated pressure from pressure generator 280.

Probe Point Structure

The following describes two kinds of probe point structures and various probe point tip designs in accordance with the invention. These probe point structures and tip designs can be used in unrestricted combination on a Tester Surface.

Solid Probe Point

As seen in FIG. 17(b), in one embodiment a solid probe point, which bends (flexes) horizontally to adjust to vertical contact loading, is relatively thin and elongated with a length to diameter ratio of approximately 1-10 to 1-40. FIG. 17(b) shows in cross-section a solid probe point structure with a central electrode 282 formed by CVD tungsten. Central electrode 282 provides contact between the metal probe point tip (preferably titanium or tungsten plated with gold) 284 and an interconnect trace in tester surface 286. The shaft 288 of the probe point is low stress CVD silicon dioxide, as is tester surface membrane 290. Together, silicon dioxide layers 288, 290 form tester surface 292.

As seen in another embodiment in FIG. 18, the probe point 312 has a silicon dioxide core 314 with a thin metal cylinder 316 formed around core 314, and an external layer 318 of silicon dioxide. Also provided are metal tip 320, metal trace electrode 322, and flexible $SiO_2$ layers 324, 326. Layers 318, 324, 326 together form tester surface 328. Cylindrical electrode 316 provides greater current carrying surface area than does the solid central electrode of FIG. 17b.

Compressible Probe Point

Figure 19B:
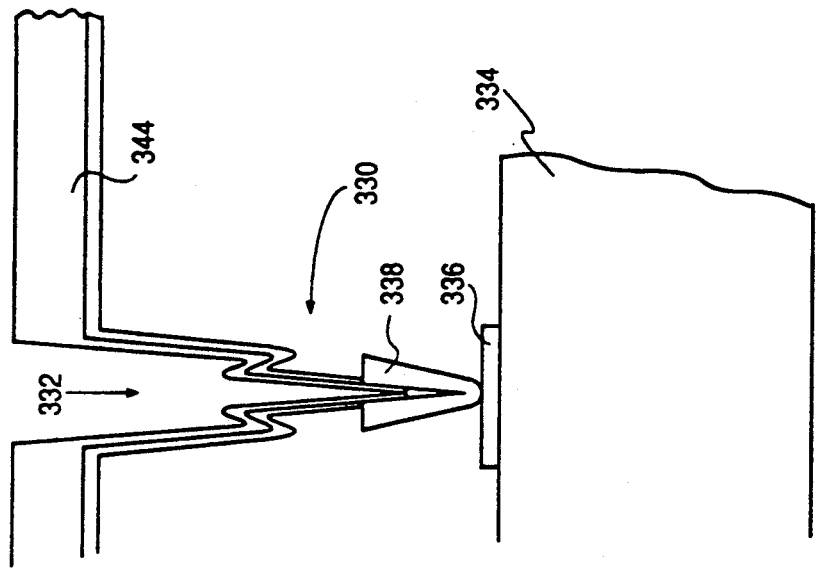
Figure 19A:
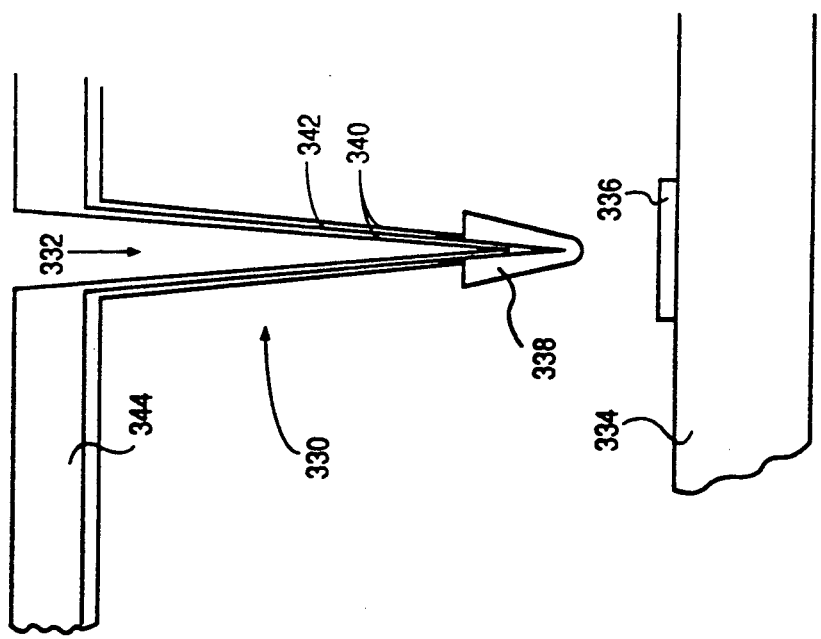

A second probe point structure 330, which is compressible, is shown in FIG. 19a. Probe point 330 is hollow and uses a fluid back pressure acting against the interior 332 of the probe point 330 to cause the compressible probe point 330 to recover its original shape after a load 334 (i.e., an IC contact point 336) which is compressing the probe point 330 has been removed. Probe point 330 includes a tip 338 of tungsten or titanium plated with gold, a wall 340 of silicon dioxide which is 100Å to 4000Å thick, and an inner gold electrode 342 of tungsten or titanium 10Å to 1000Å thick plated with gold. Also shown is tester surface 344, which is 1.5 to 4.0 μm thick. Probe point 330 is shown in its compressed (i.e. "imploded") configuration under load 334 in FIG. 19(b).

Figure 20B:
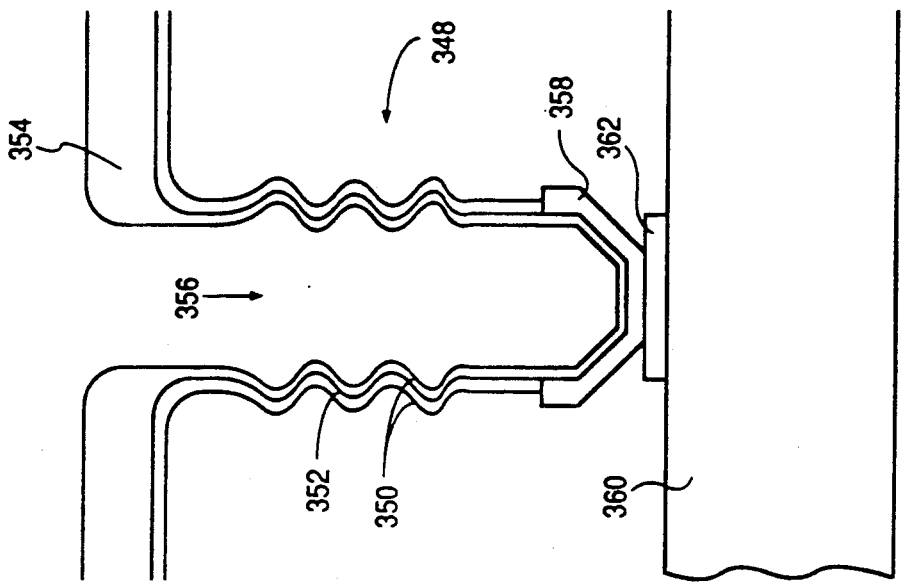
Figure 20A:
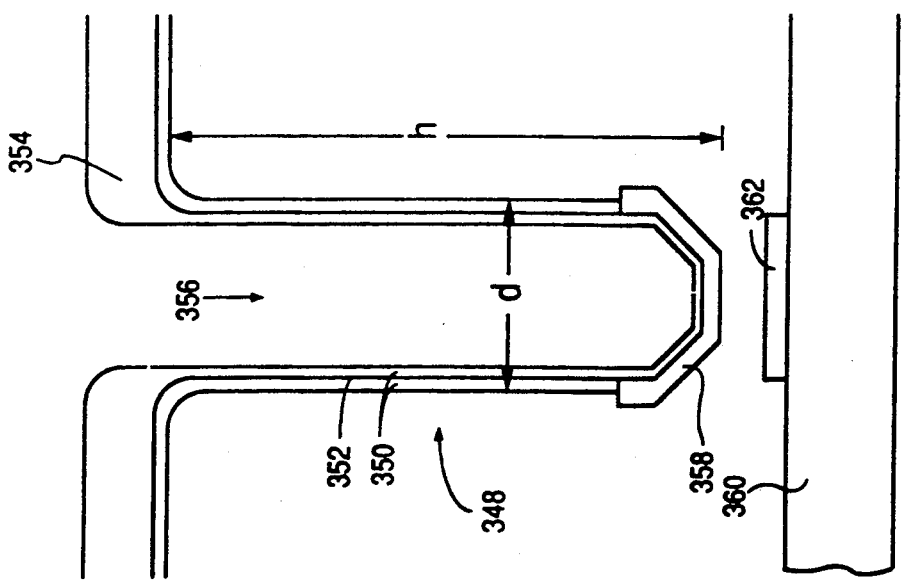

As shown in FIG. 20(a), another probe point structure 348 has a diameter d of approximately 1 to 4 micrometers and a height h of approximately 4 to 12 micrometers. The wall or probe point 348 is composed of a layer of silicon dioxide 350, and an embedded layer of metal 352, with a total thickness of approximately 100Å to 4000Å. The tester surface 354 is silicon dioxide, typically 1.5 to 4.0 μm thick. The wall or the probe point may also be composed of a layer of metal and an internal layer of silicon dioxide with a similar probe point 348 wall thicknesses in cross-section. The interior 356 of the probe point is hollow to allow a fluid to enter and fill the interior 356. The tip 358 of the probe point is preferably a refractory metal with gold such as tungsten/gold or titanium/gold as described below.

Probe point 348 of FIG. 20(a) is shown in FIG. 20(b) wherein probe point 348 is compressed by contact with a contact pad 362 of a circuit device under test 360. As shown in FIG. 20(b), the probe point height is compressed by approximately 1 to 4 micrometers. The sidewalls 350, 352 of probe point 348 partially collapse due to the non-elastic nature of the silicon dioxide layer 350. However, the relative thinness of the sidewalls 350, 352 of probe point 348 and their low surface tension allow the probe point 348 to recover its shape when the load is removed as in FIG. 20 (a). The fluid filling the interior portion 356 of probe point 348 is preferably commercially available Florinert. The sidewalls 350, 352 of probe point 348 are substantially thinner than the supporting low stress silicon dioxide membrane 354, which has a thickness of typically 1.5 to 4 micrometers. The sidewall of the probe point 348 includes an embedded metal cylinder electrode 352 which connects the metal probe point tip 358 with electrically conductive interconnect structures (not shown) interior to the silicon dioxide membrane 354 supporting probe point 348.

Optionally, in the case of compressible probe point 348, during fabrication (described below) the interior of the probe point 356 may be filled by metal deposition and selectively etched removed until only the metal at the interior tip 358 remains. This metal backing of the probe point tip 358 strengthens it.

Hybrid Probe Point Structure

Figure 21:
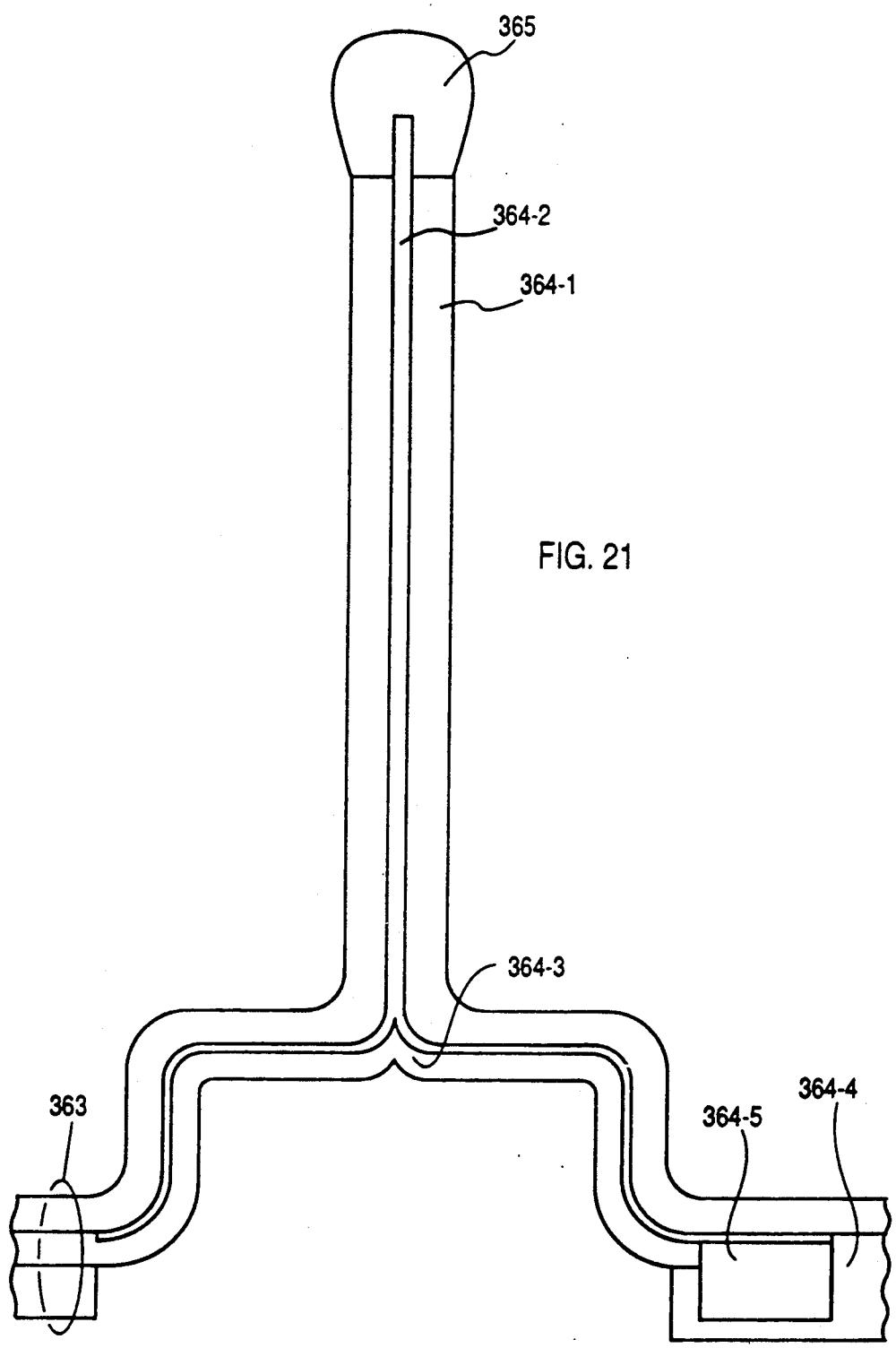

FIG. 21 shows in cross-section a hybrid (both solid and compressible) probe point structure design. This structure provides stress minimization where the probe point attaches to the tester surface 363. The probe point is preferably fabricated primarily from low stress silicon dioxide 364-1, 364-3, 364-4. The probe point has a metal (preferably CVD tungsten) core 364-2 with external silicon dioxide walls 364-1. Also shown is titanium or tungsten gold plated tip 365, and metal trace layer 364-5.

Other Probe Point Structures

FIG. 22 shows in cross-section three compressive-type probe points 366-1, 366-2, 366-3 with respectively blunt metal probe tips 368-1, 368-2, 368-3 on the tester surface 370. Tester surface interconnect trace 372 is shown making contact with the cylinder shaped electrode 374 of a probe point such as 366-2 embedded in the low stress silicon dioxide tester surface 376 and side wall of probe point 366-2 and providing a connection between the tester surface interconnect trace 372 and probe point tip 368-2. An optional hard metal backing interior to the probe point and just behind probe point tip 368-2 is not shown.

Each probe point 366-1, 366-2, 366-3 has a similar diameter d and is compressible with a center-to-center spacing x between adjacent probe points. Distance x is typically 1 to 20 microns, but is preferably a distance of no less than approximately 1.5 times distance d. This spacing allows the tester surface to probe integrated circuits of minimum feature sizes at the device (i.e. transistor) level. FIG. 22 shows probe points 366-1, 366-2, 366-3 in an unloaded configuration.

FIG. 23 shows in cross-section the same probe points 366-1, 366-2, 366-3 of FIG. 22 in contact (under load) with a DUT 380. The figure shows that the compressible probe points 366-1, 366-2, 366-3 each accommodate the height variances of the various DUT contacts 380-1, 380-2, 380-3, thus showing the independent height adjustment capability of each probe point which can be as much as 40% of its length. As shown, each probe point 366-1, 366-2, 366-3 (exclusive of metal probe point tip 368-1, 368-2, 368-3) deforms approximately 1 micrometer for every 2 to 3 micrometers of probe point height. The surface thickness of the probe point wall 382 is approximately one quarter or less of the thickness of the supporting test structure membrane 370. In the case of functional tester application where probe points may approach or exceed one mil diameter, the probe point wall (or sidewall) may be the same thickness as the supporting test structure membrane. A thinner wall of the probe point will result in greater flexibility.

FIG. 24 shows another configuration of compressible probe points 386-1, 386-2, 386-3 with a pointed probe point tip 388-1, 388-2, 388-3. The shape of each probe point tip such as 388-1 contributes to the contact capability of the probe point 386-1 independently of the diameter of the probe point body 390 by providing a smaller probe point contact feature size and improving the efficiency for breaking through native metal oxides that may form on a contact pad to be probed. Various probe point tip designs can be fashioned by the probe point fabrication process in accordance with the invention as described below.

As shown, the center-to-center x spacing between the probe points is approximately 3 to 6 micrometers. Each probe point is approximately 2 to 4 micrometers in diameter d. The height h of each probe point is approximately 4 to 10 micrometers. As shown in FIG. 25, the same structure shown in FIG. 24 when under load from DUT 392 is deformed slightly. The side wall, which is approximately 1000Å to 4000Å $\mu$m thick, is compressed by the load of DUT contacts 394-1, 394-2, 394-3. The tester surface 396 is approximately 1.5 to 4 micrometers in thickness.

Tester surface 396 is preferably low stress silicon dioxide or silicon nitride. Each probe point tip 388-1, 388-2, 388-3 is constructed of a hard core such as titanium or tungsten (an appropriate barrier metal layer may be used to prevent the formation of native oxide on the selected hard metal) which is optionally electroplated with pure gold. The pointed probe point tips 388-1, 388-2, 388-3 of the probe point in this embodiment allows low pressure contact to be made to the device under test 392. The compressible probe point structure allows uniform pressure for all probe points and to provide independent vertical adjustment of closely spaced probe points 386-1, 386-2, 386-3.

FIGS. 26(a) and 26(b) show another configuration of hybrid probe points with a compressible probe point body portion 400 supporting an elongated solid probe point 402. The compressible portion 400 of the probe point as described above is hollow and typically filled with a fluid 404. As shown in FIG. 26(b), the probe point configuration of FIG. 26(a) is compressed under a load 406. The solid portion 402 of the probe point has a diameter s of approximately 0.5 to 1.0 micrometers. The side walls of the compressible probe point portion 400 are approximately 0.25–0.5 micrometers thick and formed of low stress silicon dioxide 408 with internal metal 410. The compressible portion 400 of the probe point has a diameter d of approximately 1–5 micrometers.

The probe point compressible portion 400 is formed on a tester surface 412 which is typically 1.5 to 4.0 $\mu$m thick. The tip 414 of the solid portion 402 is tungsten or titanium plated with gold.

Probe Point Fabrication

In the above-described probe point structures, the probe point preferably has a hard metal tip in order to electrically contact the contact electrodes or pads of the device under test. The tip can have various shapes such as a flattened cone as shown in FIGS. 22 and 20(a), or pointed as shown in FIGS. 19(a) and 24. The probe point tip as described above preferably has a hard metal core such as tungsten or titanium, and a gold plated surface which can be periodically replated as a maintenance step. These probe point structures are dimensionally scalable in accordance with conventional semiconductor process technologies, and with the decreasing circuit device element minimum feature sizes, to allow electrical contact with various circuit device contact pads (electrodes) of 1 $\mu$m or less diameter. The fabrication of the probe points is accomplished as follows to produce a probe point of approximately one-half 29 to several micrometers in diameter. FIGS. 27(a) through 27(h) show fabrication of a compressible probe point; FIGS. 28(a) through 28(h) show corresponding steps in the fabrication of a solid probe point as described immediately below.

1. Trench or etch a hole 420 (FIGS. 27(a) and 28(a)) with a depth and diameter equal to the dimensions of the desired probe point body in the semiconductor substrate 422 (wafer) or substrate material upon which the tester surface will subsequently be deposited. Optionally, a 0.5 to 2 μm layer of low stress silicon dioxide (not shown) may be applied prior to etching providing an initial tester surface thickness. Deposit by CVD (Chemical Vapor Deposition) means a 100Å to 2000Å thickness of low stress silicon dioxide 424 in the trench or hole 420 as in FIGS. 27(b) and 28(b). In one embodiment, one first deposits a very thin (100 Å) barrier (protective) layer such as nichrome or tungsten (not shown) to separate the probe point from the substrate 422 during selective etch removal of the substrate; the protective metal later is subsequently removed.

2. CVD 100 Å to 300 Å of tungsten 426 and optionally, a metallization enhancement deposition of 200 to 1000 Å of gold over the low stress silicon dioxide layer 424, as in FIGS. 27(c), 28(c). Mask and fashion metal traces in the tungsten layer 426 between probe point trenches 420 on the substrate 422 surface with conventional techniques as required.

3. CVD low stress silicon dioxide 428 from 1000 Å to 2000 Å thick into the trench 420, completely (or nearly so) filling the trench 420 which is the case in fabricating the solid probe structure in FIG. 28(d). In the case of compressible probe structures in FIG. 27(d) it may be desired to subsequently fill the trench 420 with a polysilicon or metal layer 429 and then by selective etch remove the deposited material except for the last 1 or 2 μm in order to form a hardened backing to the probe point tip that is interior to the probe point.

Figures 28A, 28B:
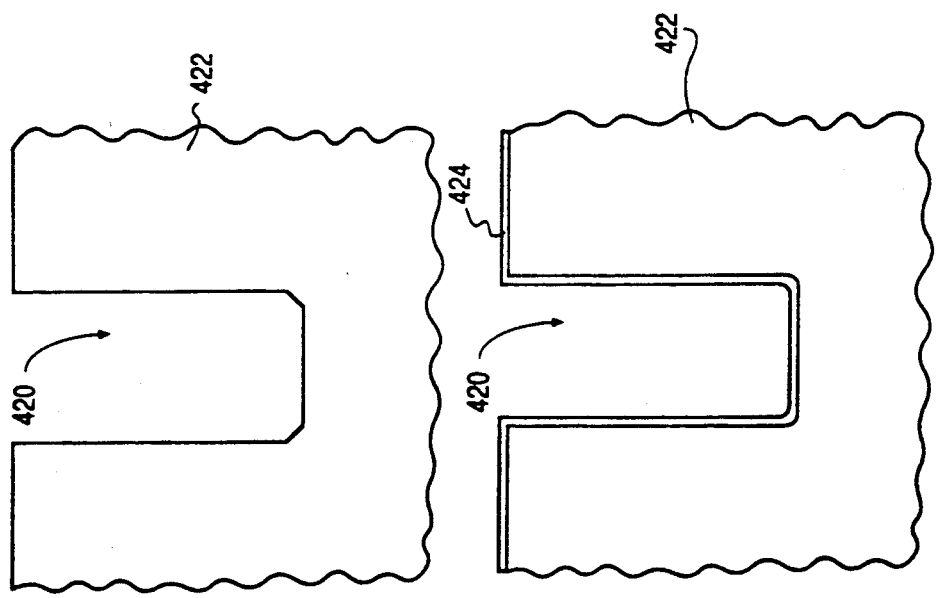
Figure 28C:
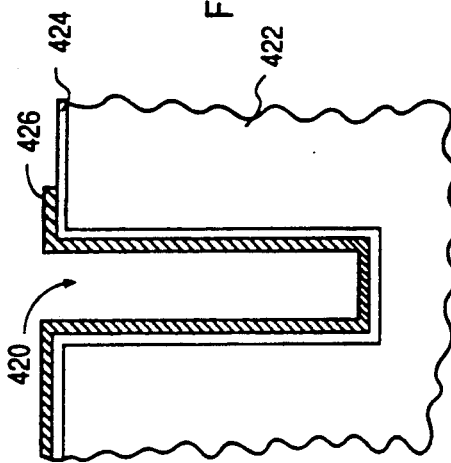
Figure 28D:
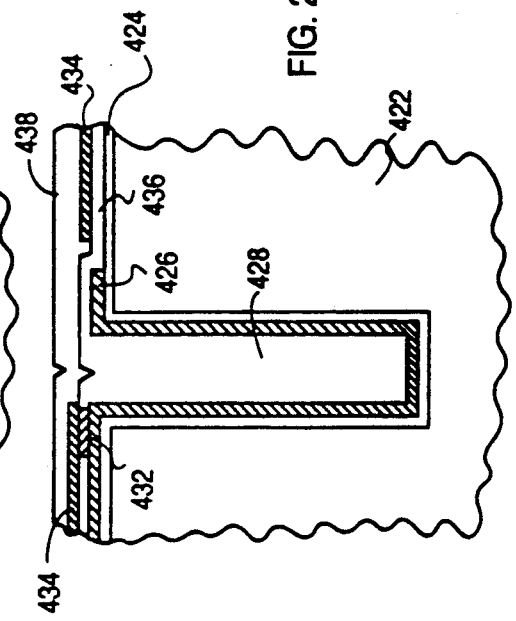

4. Open vias 432 to probe points and deposit one or more additional metallization interconnect layer 434 as shown in FIGS. 27(d), 28(d) with a dielectric layer 436, 438 of low stress silicon dioxide of appropriate thickness to achieve the overall desired silicon dioxide thickness of the tester surface.

Figures 27A, 27B:
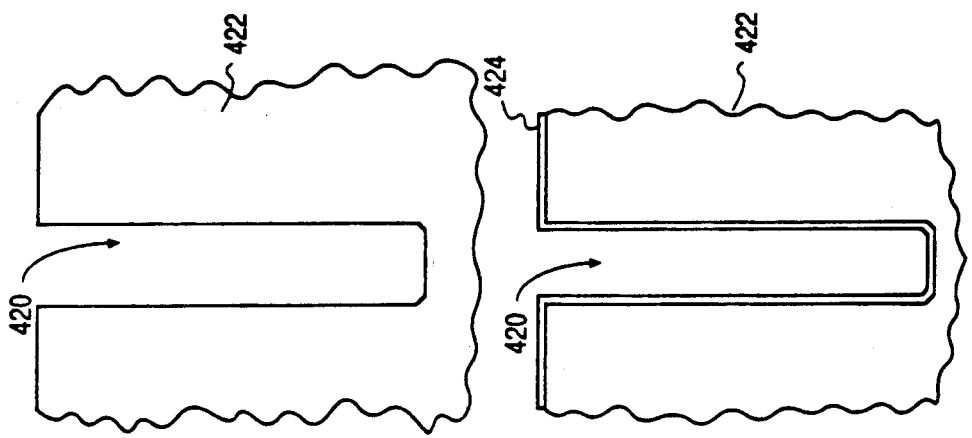
Figure 27C:
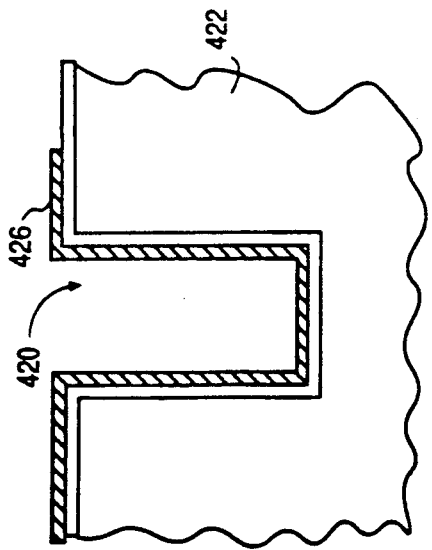
Figure 27D:
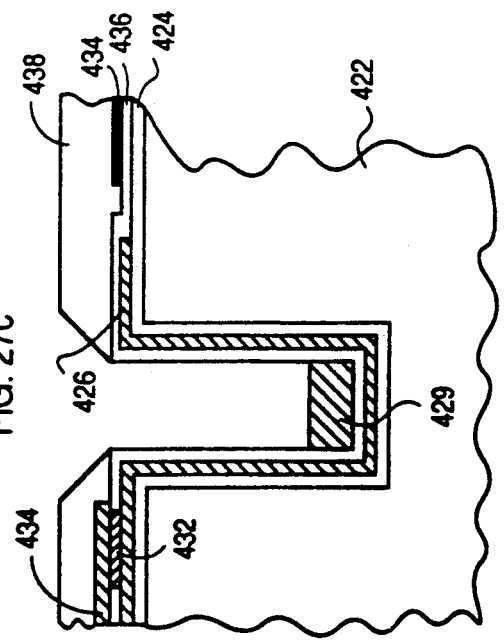
Figure 27E:
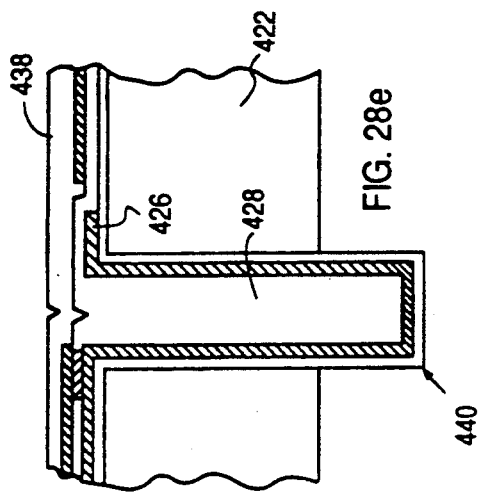
Figure 28E:
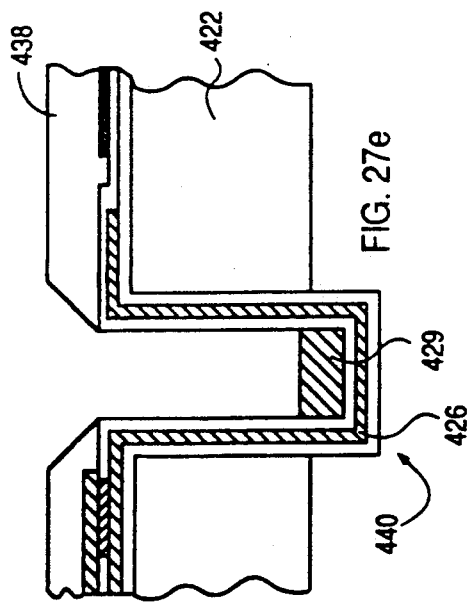

5. After the tester surface has been bonded to the support plate (not shown), probe point tip processing is as follows:

(a) Selectively etch substrate 422 until 1 to 2 μm of the tip 440 of the probe point structures is exposed as in FIGS. 27(e) and 28(e).

Figure 27F:
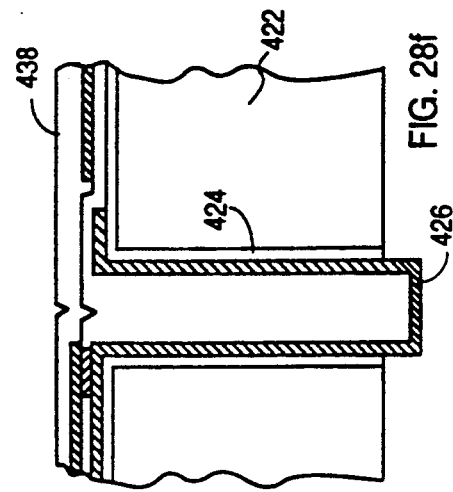
Figure 28F:
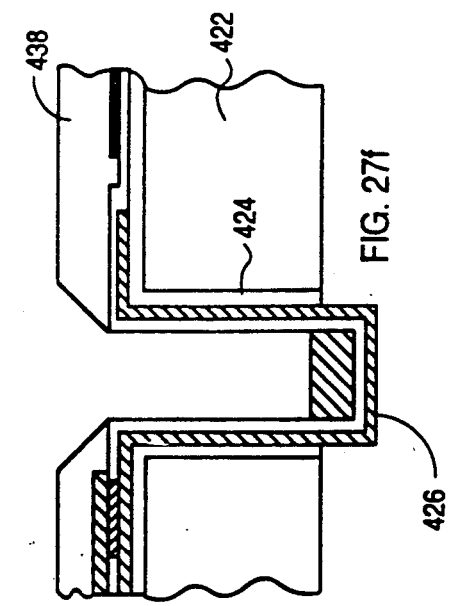

(b) Etch any barrier metal layer and first layer of low stress silicon dioxide 424 to expose the first metal layer 426 in FIGS. 27(f) and 28(f).

(c) Electroplate refractory or hard metal 442 by applying the appropriate uniform voltage potential to the exposed probe electrodes 426 and by placing the tester head assembly in a float so that only the tester surface is submerged in the electroplating bath (not shown). Or alternatively in combination with standard IC resist patterning techniques as in FIGS. 27(g) and 28(g), pattern with resist mask 446 and etch to form a mold for the probe tips as desired with conventional IC processing. Probe tip hard metal thickness may vary from 1000 Å to several μm.

FIGS. 27(g), 28(g) also show the use of two layers of resist. The first layer of resist 446 (i.e., first deposited on substrate 422) is developed through an opening 448 in a second resist layer 450. The harder protective second resist layer 450 allows the sidewall of opening 450 through the first resist layer 446 to be etched with an undercut forming a mold for the probe point tip 442. The use of two resist layers 446, 450 to form an opening 450 with an under-cut sidewall as shown is conventional IC processing.

Figure 28H:
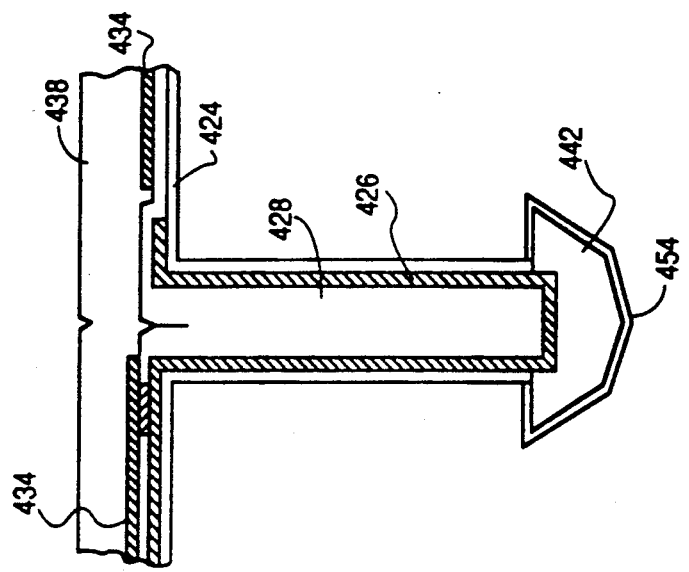
Figure 27H:
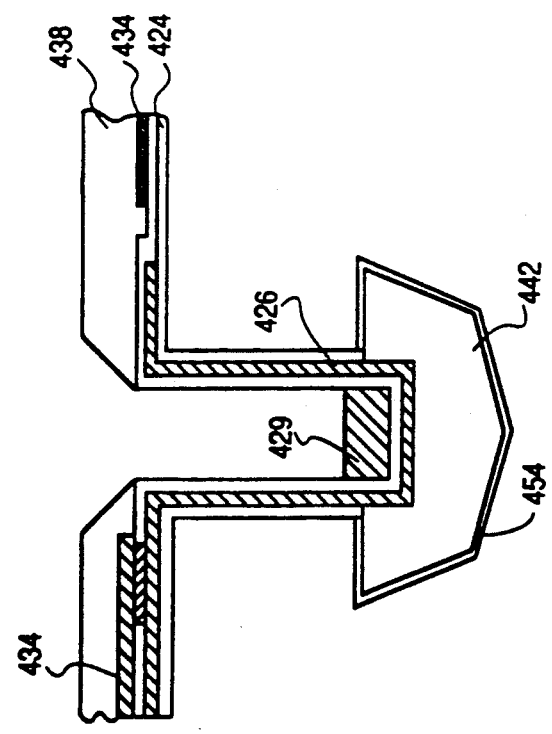

(d) Complete the selective etch removal of substrate 422 and any metal protection barrier as in FIGS. 27(h) and 28(h).

(e) Electroplate the probe point tip with a gold layer 454 (0.9999 pure) to promote ohmic contact to the DUT (not shown), or electroplate with other metal such as copper; the electroplating is achieved by applying a uniform voltage potential to all or selected portions of the probe points. The voltage potential is supplied to the probe points through the metal interconnect traces 426, 434 that have been fabricated in the tester surface.

As described above, the probe point tip fabrication process involves selectively etching away the substrate in which the probe point is formed, first exposing an appropriate portion of the tip of the probe point. The selective etching of the substrate is then stopped (the substrate acting effectively as a protective layer for the lower portion of the probe point protecting the external silicon dioxide layer of the tester surface), and the exposed silicon dioxide layer of the probe point tip is etched away to expose the metal core of cylindrical electrode, and then the probe point is plated up or enhanced with a refractory metal such as tungsten or titanium. The selective etch of the remaining portion of the substrate to be removed is then continued.

Figure 29:
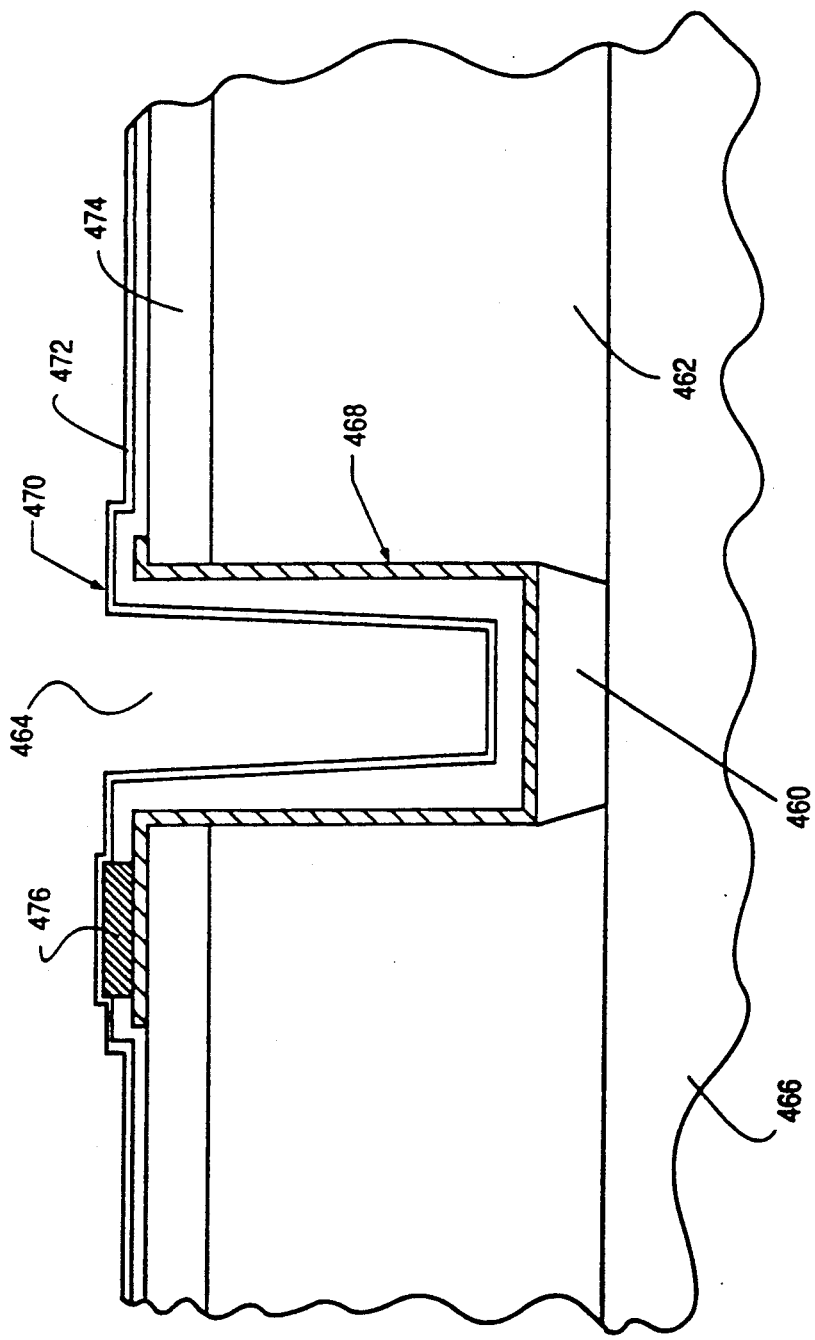

In an alternate embodiment (see FIG. 29) of probe point fabrication, the probe point tip is fabricated first by patterning a thin film of metal deposition 460 on a silicon substrate, and then covered with polysilicon or a polymer layer 462 of 4 to 10 μm thickness through which holes such as 464 are anisotropically etched to the preformed probe point tips in which the probe points are formed (as also shown in FIGS. 27(a), 27(c) and 27(d)) as shown in cross-section in FIG. 29. Also shown in FIG. 29 are as described above tungsten/gold layer 468, and low stress silicon dioxide layers 470, 472, 474 and electrode 476.

Once the probe points are fabricated the silicon substrate 466 and the polysilicon or polymer layer 462 are selectively etched away leaving free standing probe points as shown by FIGS. 27(h) or 28(h). This alternate fabrication method allows the probe point tips to be fabricated first, therefore avoiding fabrication steps while selectively etching the substrate away from the probe points. This embodiment is most effective for probe points of less than 10 μm in length.

Probe Point Tester Surface Interconnect Structure

The following describes preferred embodiments of the interconnect metallization in the tester surface which connect the probe points to integrated circuitry on the tester surface about the probe point bladder area, or to contact pads about the probe point bladder area. The method and structure described here provides the simultaneous access to a plurality of ICLUs or circuit devices for the purpose of testing them with a generic row and column organization method, and requiring typically only two layers of interconnect metallization in the tester surface. The organization of the interconnect metallization and the control logic it connects to are independent of the placement of the ICLUs on the surface of the substrate to be tested. Only the positioning of the probe points and the test signal are specific to the ICLUs of the DUT. Therefore, the design of each tester surface does not require a custom layout/logic design to fit the placement of ICLUs of the DUT.

Figure 30:
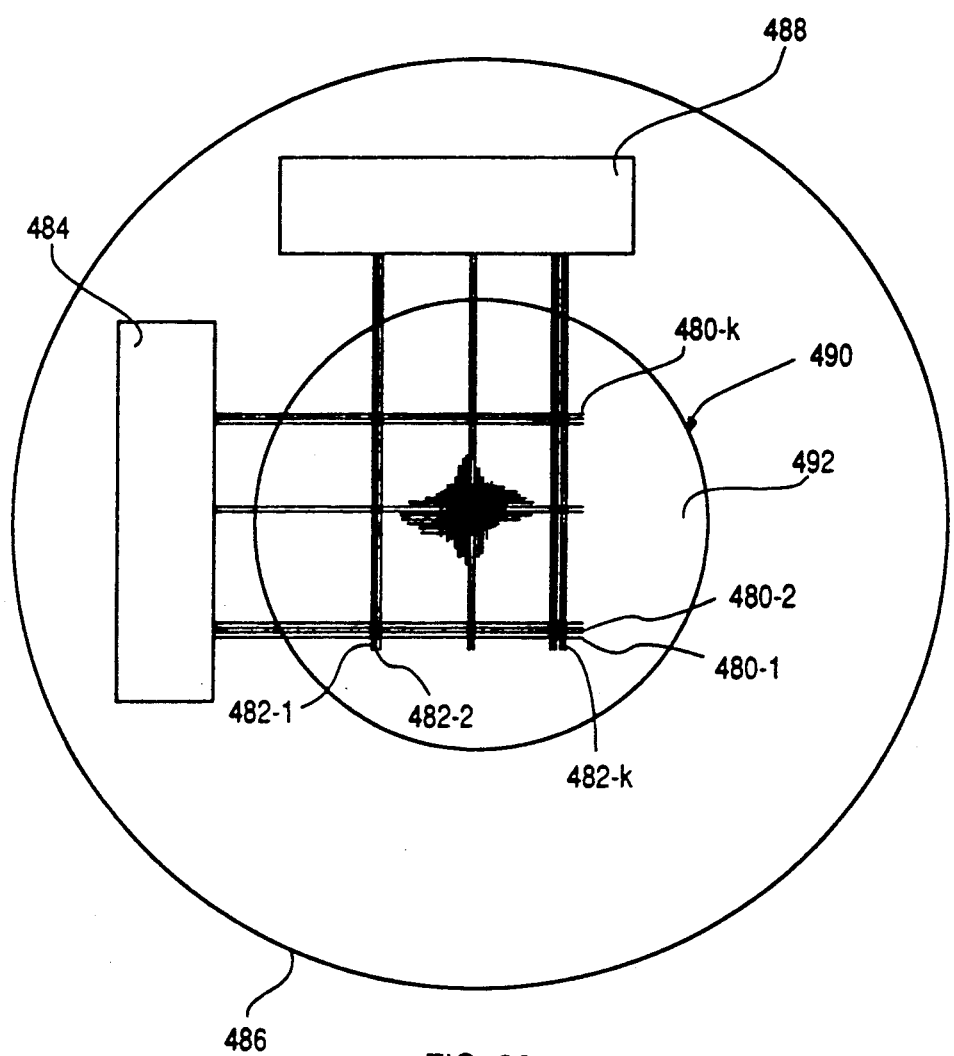
FIGS. 30, 31 show tester surfaces.

FIG. 30 shows a top view of a tester surface. Shown are x-axis probe point interconnect traces 480-1, 480-2, .

..., 480-k which together are one metallization layer and y-axis probe point interconnect traces 482-1, 482-2, ..., 482-k which are a second metallization layer. The x-axis traces 480-1, 480-2, ..., 480-k are connected to integrated row (x-axis) selection control logic and test signal generator circuitry 484 mounted on tester support plate 486. The y-axis traces 482-1, 482-2, ..., 482-k are connected to integrated column (y-axis) selection control logic and test signal receivers circuitry 488, also mounted on tester support plate 486. The edge 490 of tester fluid bladder 492 defines the effective test surface area.

The interconnect metal layers are designed to provide simultaneous contact to all of the ICLUs or circuit devices for a specific area of the DUT in one physical contact, and provide the ability to test the ICLUs in a sequential or parallel fashion. The fine-grain approach in accordance with the invention requires only a limited number of probe points to test an ICLU. Therefore, for each small area of substrate in which the ICLU is fabricated, a number of probe points must be provided. The probe points required per ICLU or circuit device will typically vary from two to ten. The placement of the ICLUs may be orderly as in the case of a gate array or memory circuits, or random as in the case of custom circuit design, but the organization of the interconnect to the probe points for the ICLUs to be tested are approximately a row and column structure from a testing procedural stand-point.

The interconnect metallization structure of the tester surface will typically have two layers of metallization as shown in FIG. 30, but three and four metal layers of designs are used in other embodiments. All the traces of a specific metal layer are patterned parallel to either one of two reference layout coordinate axes (the x-axis or y-axis) as shown in FIG. 30.

ICLU input signal and/or power voltage reference are provided along one axis (x-axis), and ICLU output signal and/or ground voltage reference are provided along the orthogonal axis (y-axis). In this manner by selecting (addressing) specific metal traces by control logic on either axis, a specific ICLU can be independently tested at the intersection of the metal traces.

The information for the selection and test signal generation on an ICLU specific test basis is derived from the CAD layout database of the circuit. The CAD layout database defines the placement of ICLUs (input and output electrode contacts) and the circuit function (electrical specification) of the ICLU. This provides the information sufficient for placement of tester surface probe points and metal trace interconnection identification for subsequent selection of the ICLU during testing.

An ICLU is tested when x-axis and y-axis metal traces are selected specific to the one ICLU that is at the intersection of the selected x-axis (row) and y-axis (column) metal traces. Therefore, during one physical contact with the DUT by the tester surface, all the ICLUs of interest in probe point contact with the tester surface are simultaneously tested in an electronic sequential row versus column selection process. Input and output signals are organized by reference axis to prevent the testing of an ICLU other than the ICLU of interest.

ICLUs are electronically tested in parallel when multiple column (output) metal traces corresponding to the output signals of two or more ICLUs are selected by separate signal processing test control electronics versus the selection of one row (input) of metal traces which provide common input signals to all the ICLUs of interest in the selected row. This requires that the ICLUs or circuit devices undergoing parallel testing in this manner have identical input function, i.e. the selected ICLUs accept the same input signals, but may generate the same or varying output signals within the definition of the test being performed. Therefore, during one physical contact with the DUT by the tester surface, all the ICLUs of interest in probe contact with the tester surface are simultaneously electronically tested in parallel in groups of two or more, until all the ICLUs of interest have been tested.

Figure 31:
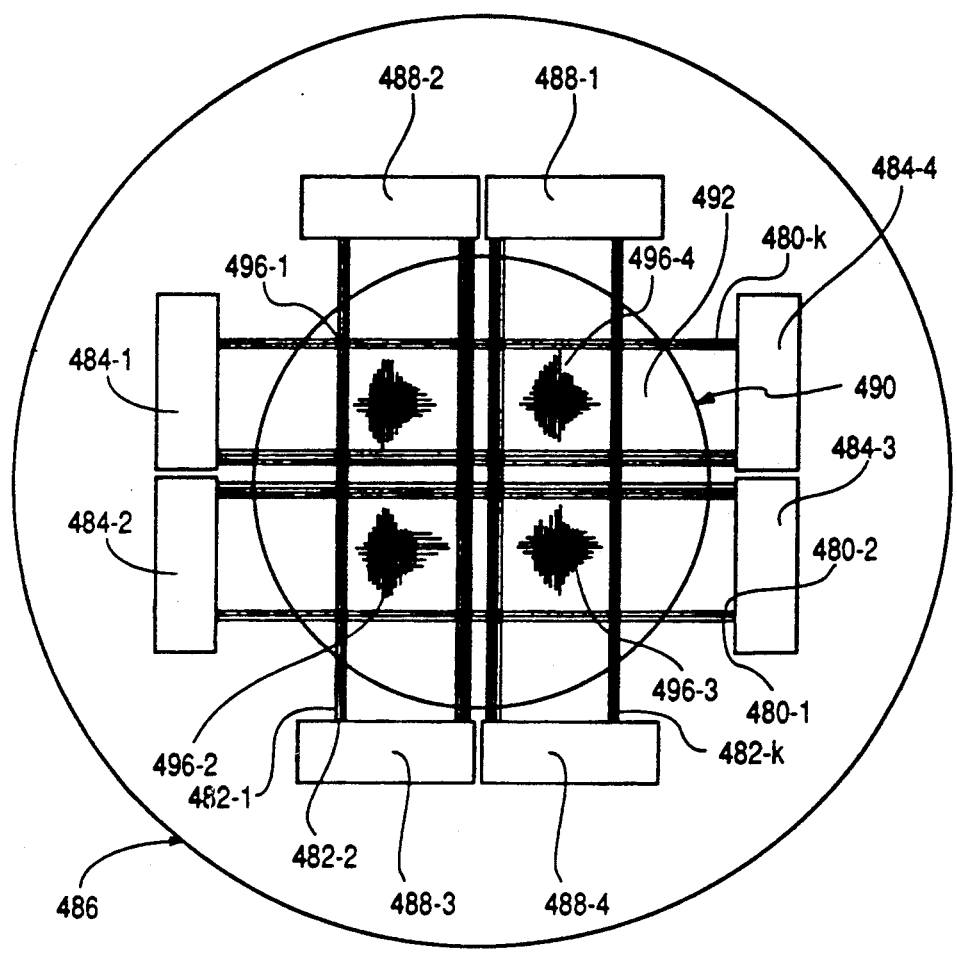

FIG. 31 shows a top view of a tester surface interconnect metallization similar to that in FIG. 30 except the device of FIG. 31 is partitioned into four equivalent areas 496-1, 496-2, 496-3, 496-4 which can be operated independently of each other (i.e. in parallel). This allows for higher tester throughout, and the simultaneous testing of functionally different ICLUs. It should be noted that similar independent parallel testing capability can also be achieved by using more layers of interconnect metallization, where each two layers of interconnect represent an independent testing means. Shown are four x-axis integrated selector control logic and test signal generator circuits 484-1, ..., 484-4, and four y-axis integrated selector control logic and test signal recover generator circuits 488-1, ..., 488-4.

The testing methods described above are facilitated by testing the ICLUs or circuit devices prior to the fabrication of metal interconnect between the ICLUs, and only the row and column or columns connecting the probe points to the ICLUs of interest are electrically referenced by the test control logic. The ICLUs or circuit devices prior to the fabrication of interconnect metallization are physically isolated on the substrate upon which they were fabricated, preventing electrical signals generated by adjoining ICLUs from being exchanged. The rows and columns of the tester surface not selected to reference an ICLU or circuit device are allowed to have high impedance, and therefore, to "float" (i.e., not to have one of the reference voltage potentials of the tester surface).

Numerous metallization interconnect patterns are possible for the tester surface to provide for increased parallel testing capability. Alternate methods of patterning the metallization interconnect may require more metal layers or partitioning of the pattern, as shown in FIG. 31. The invention is not limited to the examples as shown in FIGS. 30 and 31.

Active-Matrix Probe Point Control

Figure 32:
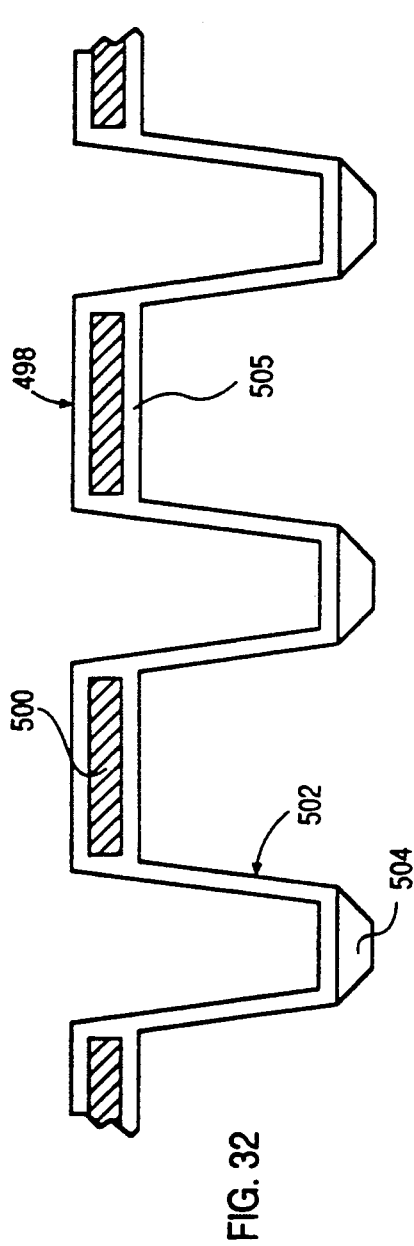
FIG. 32 shows an active matrix probe point surface.

An embodiment of the tester surface called "Active-Matrix" places a switching mechanism such as dual-gate JFET or MOSFET transistors adjacent each probe point for purposes of controlling the reference voltage into a probe point (i.e., input to the DUT) or output voltage from a probe point. The gates of each transistor are connected to a pair of orthogonal (x and y-axis) control metal traces from the control logic which are separate from the metal traces which supply test signals. This three or four metal layer interconnect structure significantly improves parallel ICLU testing capability. The active-matrix probe point structure is not limited by the use of JFET or MOSFET gates for controlling the conductive path to each probe point, other electronic switching devices that can be fabricated between the probe points may also be used. The Active-Matrix switch control logic is fabricated adjacent and interconnected to various or all of the probe points of a tester surface. The preferred fabrication technique uses established DI (Dielectric Isolation) substrate fabrication methods such as ZMR (Zone Melt Recrystallation) or ELO (Epitaxial Lateral Overgrowth) to fabricate a crystalline semiconductor substrate in which the control logic is formed. FIG. 32 shows in cross-section a tester surface 498 with control logic 500 embedded in tester surface 498 adjacent each probe point 502. The electrode interconnect between the probe point tip 504 and the control logic 500, and the metal traces that connect the switch control logic 500 with the primary tester surface control logic that is located at the edge of the tester surface are not shown.

The switch control logic semiconductor substrate 500 is fabricated prior to forming the holes in the substrate in which the probe point structures are formed as described above. A semiconductor substrate 500 of typically less than 2 μm thick is formed over a patterned layer of dielectric 505 such as silicon dioxide by one of the DI fabrication methods referenced above, and the desired circuit devices are formed by standard IC fabrication techniques. In order to improve the yield of the desired probe point circuit devices, the circuit devices and redundant devices are tested in accordance with the invention prior to forming interconnect metallization, and only functional circuit devices are used to complete the switch control logic. Once the switch control logic is fabricated the fabrication of the tester surface is completed as described elsewhere in this specification. FIG. 32 is not intended to limit the Active-Matrix embodiment, but is exemplary. The overall interconnect layout and its control means are regular in design, or are independent of the placement of individual ICLUs to be tested on the IC substrate.

Application of Polymer and Polysilicon Films in Tester Surface Fabrication

Polymer films have recently become commercially available at a thickness of less than 10 μm. These films are mechanically formed and the non-uniformity in thickness of these films is significant and can vary more than a micron. Other polymer film utilization issues such as their ability to be shaped (as required by the bathtub-like depression in FIG. 15 which can be 2 mils to over 100 mils deep), low temperature processing restrictions, the difficulty in the processing of very small vias (typically with a diameter of less than 10 μm) sensitivity to standard metal etch chemicals, present limitation to only two metal layers (one either side of the polymer film, no multiple metal layers per side), and the attachment or bonding efficiency of the film with a large number of small metal traces, limit the effectiveness of present application of polymer films to probe points of 1 mil diameter and spacing of approximately 50 μm or 2 mils.

Low stress silicon dioxide thin films or various other low stress inorganic thin films made from such materials as silicon nitride are suitable for the fabrication of the invention in an implementation capable of testing ICLUs with contact geometries of less than 4 μm and probe point spacing of less than 8 μm. Low stress silicon dioxide is a superior material over polymers at present for the fabrication of integrated tester electronics and tester probe surface, and the forming of independently adjustable probe points.

The combined use of conductive elastomeric polymer film and low stress silicon dioxide or other low stress inorganic materials may be used to overcome present geometry and metal layer restrictions that currently limit the use of polymer films in certain testing applications. Multiple low stress silicon dioxide and metal layers can be deposited on one or both sides of a polymer film with the initial layer of low stress silicon dioxide acting as a protective layer of the polymer to subsequent metal and via processing steps. This is directly applicable to the functional testing of ICs in wafer sort that are currently using membranes of free-standing polymer film.

An alternate embodiment of the flexible tester surface is the application of conductive elastomeric polymer and a thin film of metal such as titanium or thin film of low stress polysilicon or both. The use of these materials provide a method for adjusting the CTE (Coefficient of Thermal Expansion) of the tester surface, and a method of filling the compressible type probe points with a material other than a fluid to cause the probe point to return to its original shape after the release of a compressive load.

The low stress polysilicon is deposited in the manner formulated by Richard S. Muller, and presented in numerous publications; one such publication is the *IEEE Transactions on Electron Devices*, Vol 35, No. 6, June 1988, "Integrated Movable Micromechanical Structures for Sensors and Actuators". The unique preparation of polysilicon taught by Muller allows the formation of polysilicon free standing flexible thin films of 1 to 2 μm thickness to be formed, and in the case of the tester surface preserves its flexible nature while providing it a CTE that more closely matches the CTE of the semiconductor substrate upon which the tester surface is applied.

Figure 33:
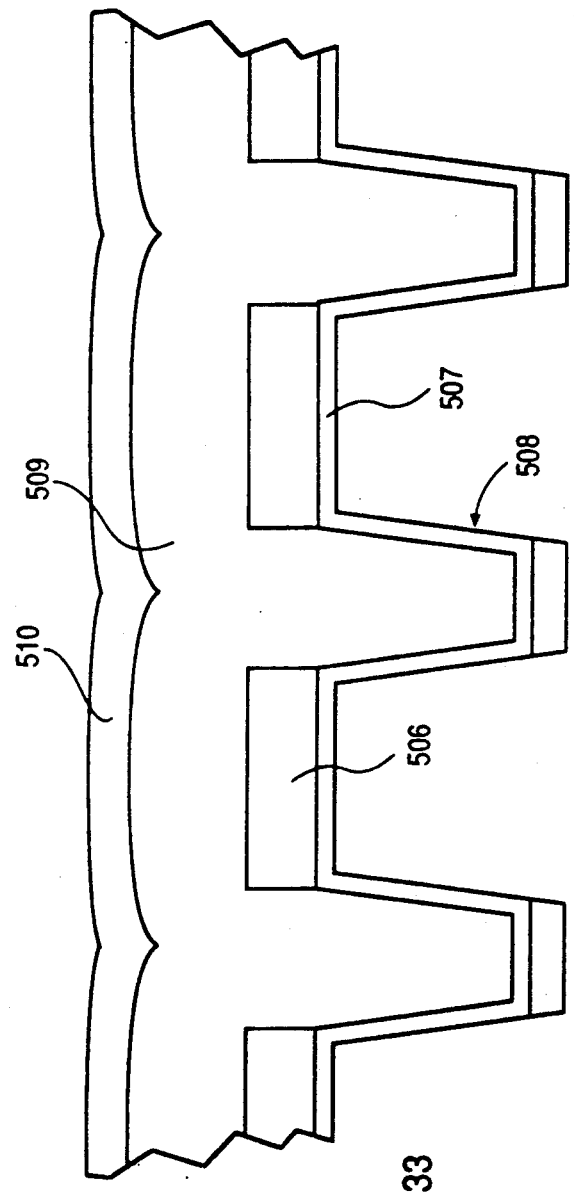
FIG. 33 shows a polysilicon film for a flexible tester surface.

FIG. 33 shows the application of this type of polysilicon 506 in a flexible tester surface. Polysilicon 506 is applied at an elevated temperature between 400° and 650° C. and is uniformly applied in the preferred embodiment directly onto low stress silicon dioxide 507. Polysilicon 506 is patterned with openings into the probe points 508. The use of polysilicon in the tester surface when the tester surface is used to test substrates of silicon improves the registration operating temperature range of the tester surface probe points in making consistent contact with the electrodes of the circuit devices to be tested.

The conductive elastomeric polymer layer 509 is deposited onto the tester surface by electroplate processing. Elastomeric polymer 509 is applied to the tester surface once it is completed and all top layer electrodes have been passivated by a dielectric layer such as low stress silicon dioxide 507 or low stress polysilicon 506. A thin film of conductive metal such as 100Å of tungsten (not shown) is deposited over the tester surface and onto the interior vertical walls of the compressible probe point structures 508. This metal film acts as a plating electrode for attracting the polymer and its conductive dopant. A conformal and uniform thin film 509 of 0.5 μm to 4 μm of the conductive elastomeric polymer is deposited filling the compressible probe points 508. A subsequent 0.5 μm to 2 μm thin film layer of metal 510 such as gold, copper or titanium is optionally deposited by electroplating over polymer layer 509 to passivate the polymer layer 509, counter balance possible compression/tension forces in the free standing portion of the tester surface, and to add additional strength or durability to the surface as required.

The method of depositing the conductive elastomeric polymer is taught by MacDiarmid of the University of Pennsylvania as described above. There are numerous polymers that may be used to form the desired conductive elastomeric polymer layer, described by MacDiarmid, such as polyacetylene, polyparaphenylene, polypyrrole, polythiophene and polyaniline. The use of a specific polymer is determined by the acceptability of its fabrication and operating characteristics.

Automatic CAD Probe Point Placement Generation From Circuit Database

Also in accordance with the invention, Computer Aided Design (CAD) automatically generates the probe point fabrication masks from the device layout placement data in the database of the IC to be tested. The CAD database of the IC design contains the placement dimension data for the electrode contacts of device elements comprising the integrated circuit to be tested. This placement data indicates where probe points are to be placed on the corresponding tester surface membrane. The database also contains connection data such as source, drain and gate electrodes, or emitter, collector and base electrodes and ICLU electrical specification data (e.g., dual-gate transistor, diode, P-type transistor, etc.). This ICLU electrode specification data is used by automatic computer generation means to create probe point placement and routing patterns from input or output tester logic devices to the appropriate probe points. The ICLU electrical specification data is used to generate the control sequence for the testing of ICLUs and the automated selection of test vectors appropriate to the electrical function specification of the ICLU.

Tester Head Assembly Structure

The following describes several embodiments of tester head assemblies. The two tester head assemblies of FIGS. 34 and 35 both are immersion liquid-cooled and provide for one or more wafers of tester logic to have pin connections directly to the tester surface, and provide the ability to optionally include tester logic integrated with the tester surface. Tester assemblies that do not have integrated test logic would have slower performance due to probe interconnect length to the DUT (Device Under Test) and hence signal delay.

Figure 34:
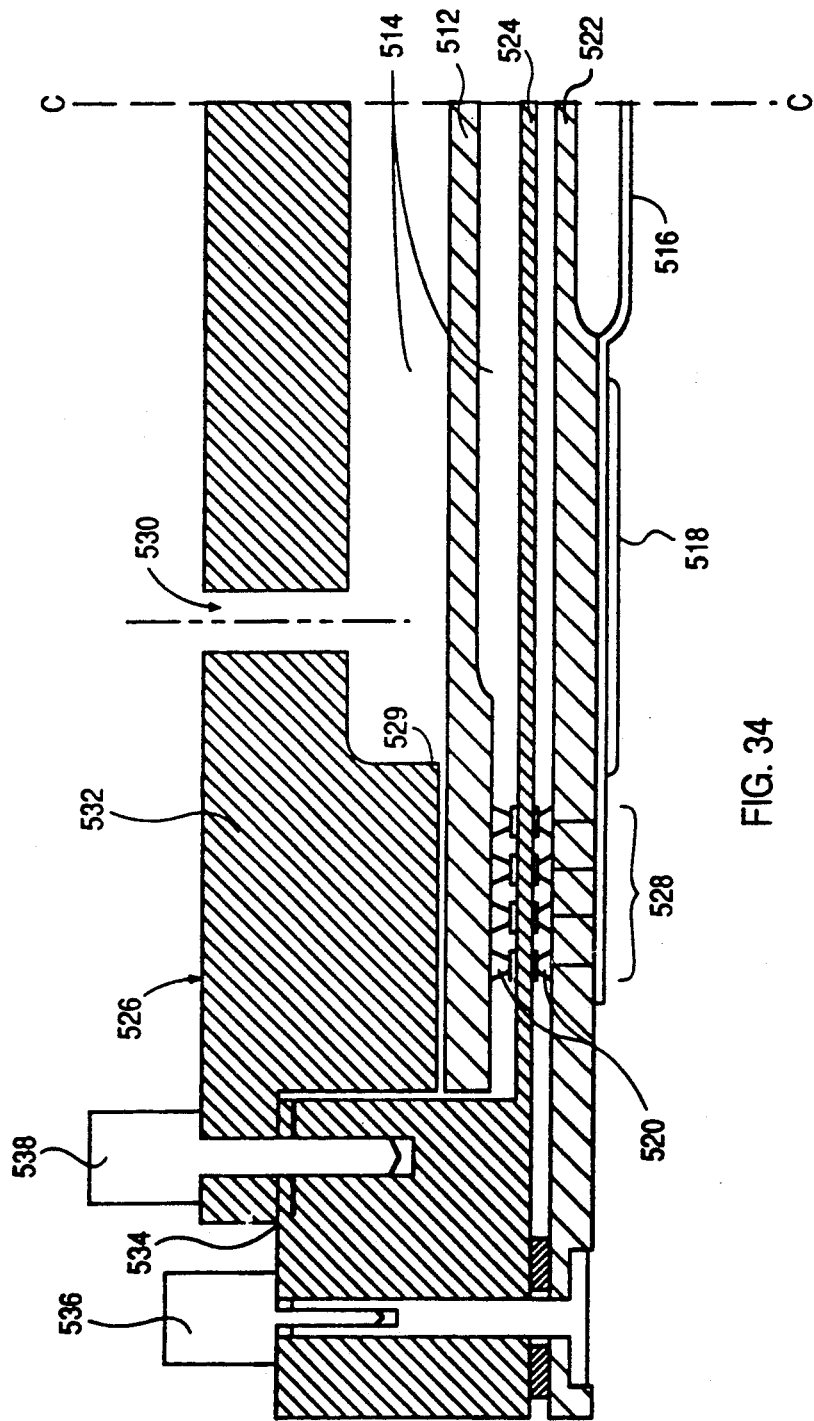
FIGS. 34, 35 show tester head assemblies.

The tester head assemblies include an interconnect structure that can use conventional IC technology or alternatively ICs made in accordance with the invention and still achieve a high pin count connection to the tester surface and DUT with a short trace length from tester logic to DUT of several mm to several cm; the analog/logic/memory IC package 512 shown in the immersion chamber 514 of the tester head assembly in FIG. 34 is a packaged integrated circuit assembly, and there can be more than one such analog/logic/memory unit in the immersion chamber 514. A tester head assembly incorporating tester surface 516 with or without integrated control logic 518 on tester surface 516 is provided, tester surface 516 is interconnected to analog/logic/memory circuit assembly 512 and use is made of immersion cooling in chamber 514. Use is made of either a conductive elastomeric contact 520 on the back side of the tester support plate 522 and between analog/logic/memory assemblies 512 or of compressible mechanical metal contacts presently available such as Pogo Contact pins manufactured by Augat of Attleboro, MA. This provides a probe surface for functional IC testing with a lower number of probe points (e.g., less than 2,000) and probe point diameters of 1 to 4 mils, or for fine-grain testing in accordance with the invention (e.g., more than 2000 probe points with diameters of less than one mil). Tester surface support plate 522 with tester surface 516 is preferably detachable from the immersion cooled analog/logic/memory assembly enclosure 526. Thus detachable support plate 522 with tester surface 516 may optionally be made more cheaply than such a structure which includes fully integrated logic circuitry 518.

The tester surface assembly may be provided with or without integrated test logic 518. Also provided is a method of packaging (interconnecting) several wafers of tester analog/logic/memory in a single cooled compact test enclosure 526, which for test instrumentation applications allows short signal length delay to the DUT. The pin interconnect 528 in the tester head assembly is preferably made from elastomeric polymer material such as conductively doped polyacetylene (as disclosed by Prof. MacDiarmid of the University of Pennsylvania and described above).

Figure 35:
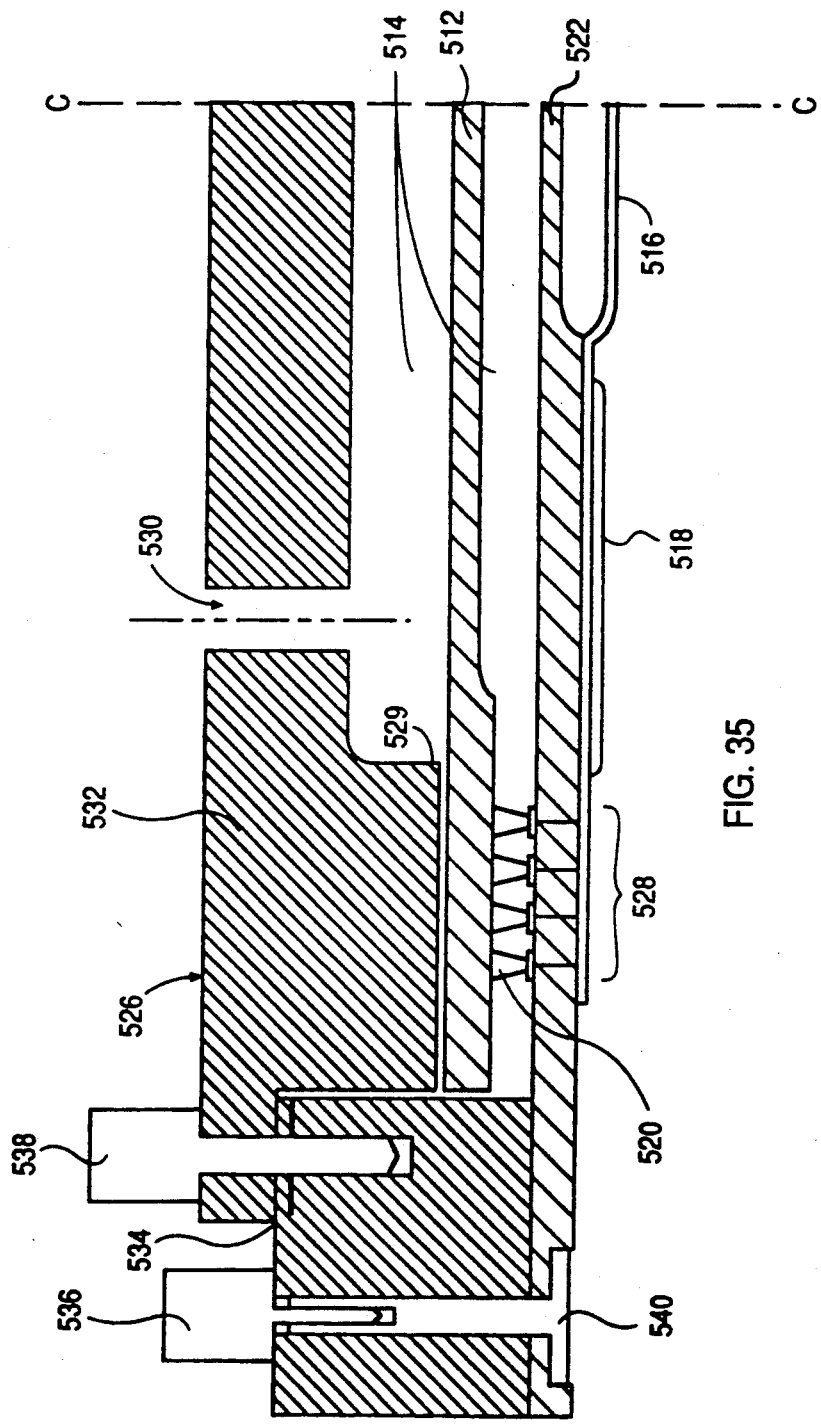

The cooled analog/logic/memory circuit packaging 512 and enclosure 526 are actively cooled with a pumped fluid such as florinert which enters and leaves the enclosure circuitry through numerous circulation ports such as port 530. The circuit package assembly 512 can also be passively cooled by heat conduction through the metal of the enclosure 526, and optionally through non-pumped fluid filling the enclosure; this requires significant areas of contact 529 between the analog/logic/memory circuit package 512 and the enclosure housing 526 (which acts as a heat sink or heat exchanger with the external ambient environment) as shown in FIGS. 34 and 35.

The cooled analog/logic/memory circuit packaging 512 and enclosure 526 as described here in application with the tester surface of the invention is not intended to be limited to this application. The packaging and enclosure can be used as a general purpose electronic packaging and enclosure, typically for but not limited to ICs manufactured in accordance with the invention.

The embodiment of the tester head assembly as shown in FIG. 34 is a circular assembly shown in cross section around the centerline C. The assembly is preferably about six to ten inches (15 to 25 cm) in diameter. The upper end plate 532 of enclosure 526 provides physical pressure contact to press the circuit assembly pin contacts 528 into contact with the contacts of the bottom end plate 524. A gasket 534 seals the contact surfaces of the upper end plate 532 and the enclosure 526. Suitable connectors (such as bolts 536, 538) are provided to hold the assembly together. The piezoelectric or other pressure control is not shown for simplicity.

The design of the enclosure provides for the optional use of integrated tester surface logic and a dense pin contact array mechanical interconnection structure that minimizes the distance between the probe points and the analog/logic/memory circuitry; the pin contact array can have in excess of 4,000 pin contacts. The design uses large ICs fabricated in accordance with the invention, although PCB (printed circuit board) circuit assemblies can also be used.

A second embodiment of the tester head assembly is shown in FIG. 35; this embodiment is similar to that shown in FIG. 34, except for the omission of the enclosure bottom plate 524 which leaves the enclosure assembly cavity of FIG. 35 open to direct contact with the tester surface 516. The tester surface support plate 522 when brought into contact with the enclosure 526 mechanically closes off the bottom of the enclosure. FIG. 35 thus shows a structure identical to that of FIG. 34 except the bottom of the enclosure 526 is open. The tester surface support plate 522 is used at the closing bottom plate. A gasket (not shown) forms a liquid tight seal, and the support (bottom) plate 522 is secured by bolts 540.

In other embodiments, the portion of the tester surface which is applied over the DUT is not a free standing membrane as described above, but is backed by an elastomeric polymer material or a rigid material such as polysilicon. These embodiments of the tester assembly have primary application in the functional testing of ICs where probe point diameters are typically greater than 10 μm and are fabricated in combination with conductive elastomeric polymer materials, or in fine-grain testing applications where planarity of the DUT is sufficiently flat to allow probe point contact without excessive pressure discontinuities across the tester surface that can result in damage to the tester surface or the DUT, or a shortened life-time to the tester surface. These embodiments, however, are not limited to testing applications.

Discretionary Metallization Interconnect for IC Fabrications

Discretionary metallization interconnect methods for an IC are provided using the tester in accordance with the invention and incorporating the use of an optical stepper and either E-Beam or Ion-Beam equipment. Once the tester means has determined required changes to a metallization or via layer of an IC, fine-grain changes are effected with the use of conventional optical stepper and E-Beam or Ion-Beam equipment by making modifications to the exposed lithographic pattern after the application of a master fixed mask pattern. The methods discussed are not restricted to specific resist materials or techniques, and single or multi-layered resists are used as required. These fine-grain discretionary metallization interconnect methods avoid the requirement that separate and unique exposure masks be prepared for the patterning of metal or dielectric thin film layers affected by discretionary interconnect changes due to defective ICLUs. These novel techniques result in lower processing costs and a reduction in mask related manufacturing costs, versus prior art discretionary techniques.

Standard optical negative resist exposure using a fixed mask is applied, and at this process step a second exposure by the optical stepper system is performed on the same undeveloped resist layer. This second step consists of positioning the lens of the stepper (without a mask) over a defective area as determined by the tester, adjusting the opening of the shutter mechanism of the stepper, and making one or more rectangular exposures that expose completely and only the area of the resist over the defective area where discretionary metal or via patterning is to be performed. Standard resists and etch processing is then resumed. The result of this augmented optical exposure step is to leave the area of the metal or dielectric thin film requiring discretionary patterning unpatterned by the initial exposure of the fixed mask pattern while patterning the remaining area, according to the original fixed mask pattern, as would be expected.

FIGS. 36(a) through 36(d) show in cross-section the use of negative optical resist and a fixed mask to form a pattern for etching a thin metal film 560 on a substrate 562 in conjunction with a second optical stepper exposure of an area requiring discretionary patterning such that the originally formed pattern of the fixed mask over the discretionary area is not patterned.

Figure 36A:
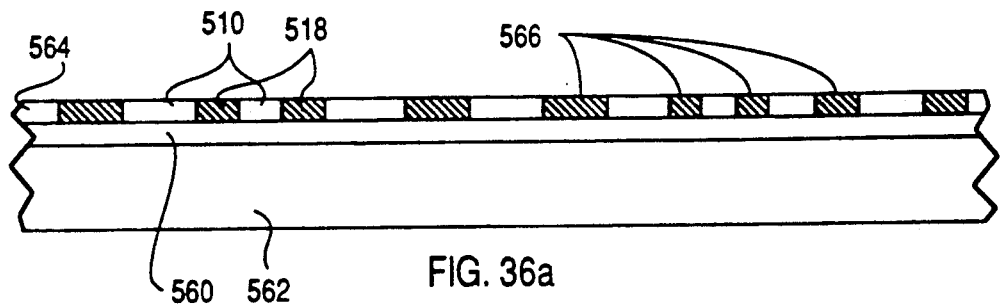
FIGS. 36 to 41 show discretionary patterning for IC fabrication.
Figure 36B:
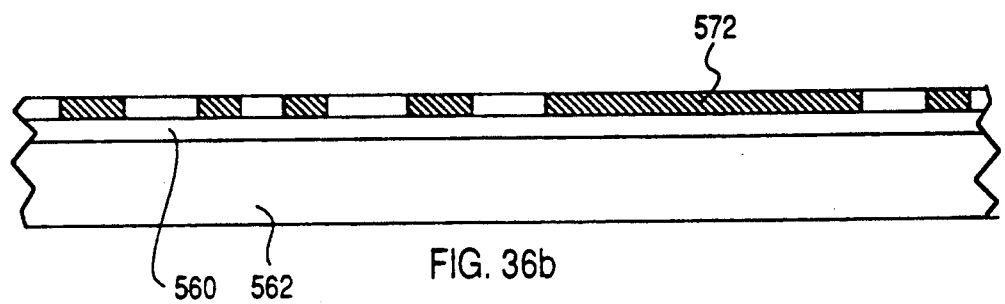
Figure 36C:
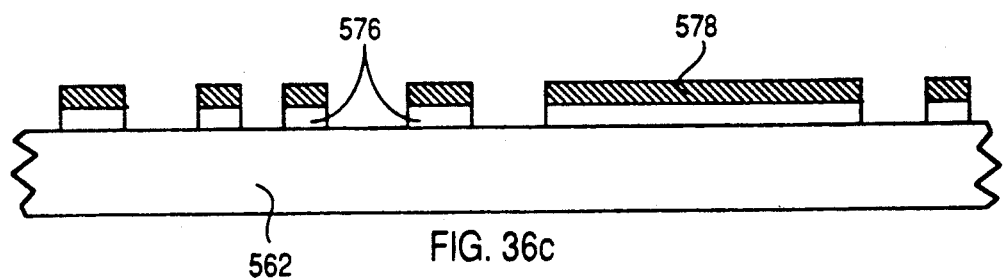
Figure 36D:
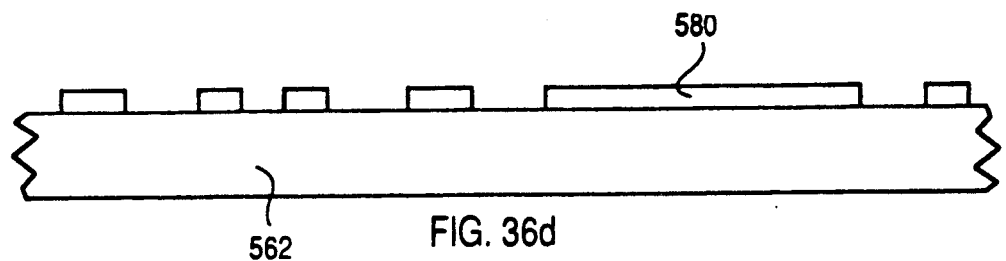

An exposed fixed mask pattern in FIG. 36(a) on a negative resist layer 564 requires fine-grain discretionary changes 566, due to defective ICLUs (not shown) as determined by the fine-grain tester, below the various portions of the fixed mask pattern exposure 568. The unexposed portions of resist are at 570. An optical stepper without a mask completely exposes in FIG. 36(b) the rectangular areas 572 of the negative resist over the areas requiring discretionary patterning, such that the original pattern in these rectangular areas 572 is erased from the resist 564. The resist 564 is developed and the underlying thin film 576 etched, in FIG. 36(c) and this leaves the thin film areas 578 requiring discretionary patterning unpatterned due to the nature of negative resist which is to develop (remain) where exposed. The resist is stripped in FIG. 36(d) and the remaining unpatterned areas 580 of the thin film designated by the tester are not patterned to prevent the interconnection of defective ICLUs. This method is applicable to both metal and dielectric thin films.

The use of a negative resist results in exposed areas of resist forming the desired pattern after development of the resist (as indicated by the hatched areas of resist). The use of negative resist allows the original pattern formed by the initial application of the fixed mask to be "erased" by a second exposure over areas that contain a circuit defect as determined by the tester means and where discretionary patterning (wiring) is required. The remaining unpatterned discretionary area is subsequently patterned by a second resist patterning and etch step with either well known optical means, E-beams, or Ion-Beam exposure.

If the choice of a negative photo-resist is inadequate for the desired optical lithographic resolution of the process step, an alternative method is to apply first a thin layer of negative resist over the substrate which is optically exposed (without a mask and by controlling the shutter mechanism) only over the areas of the substrate requiring discretionary patterning. Once developed, the negative resist will cover only the discretionary areas to be patterned, preventing these areas from being etched during subsequent processing. The standard positive photoresist is then applied, exposed and developed over the substrate including the negative resist covered areas. The layer is etched and the two resist layers are stripped. The areas requiring discretionary patterning are left unpatterned.

Figure 37A:
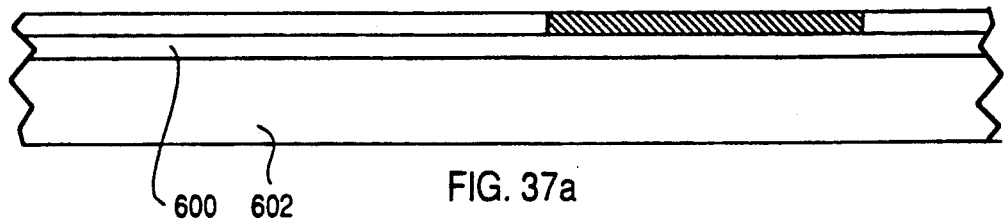
Figure 37B:
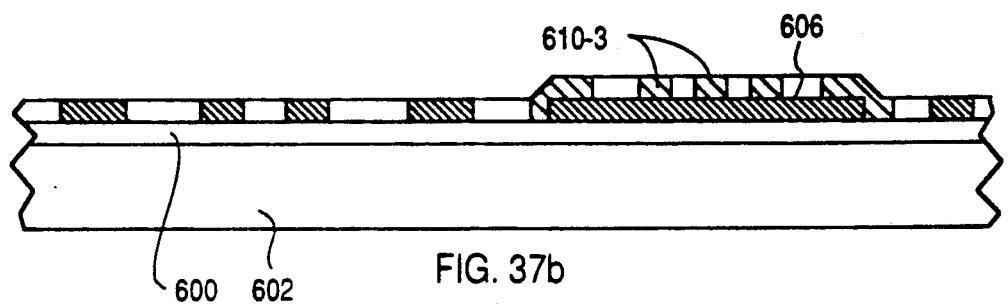
Figure 37C:
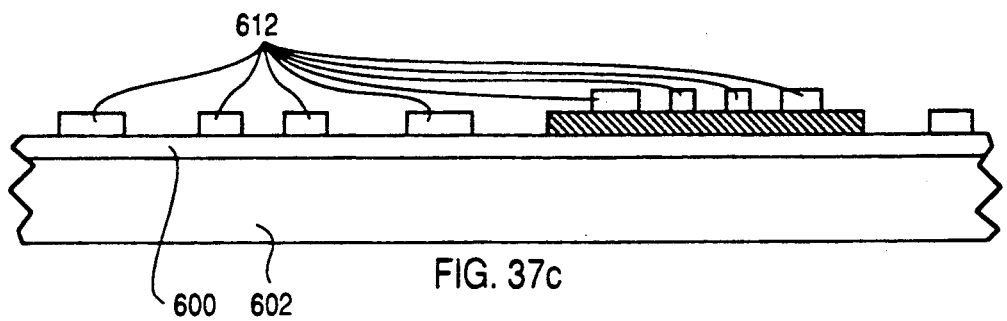
Figure 37D:
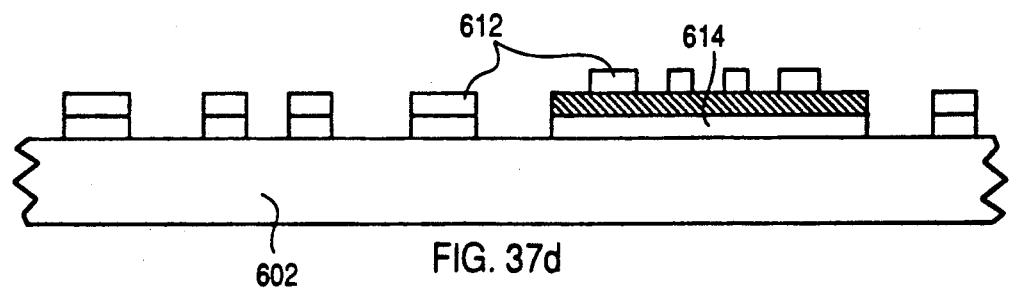
Figure 37E:
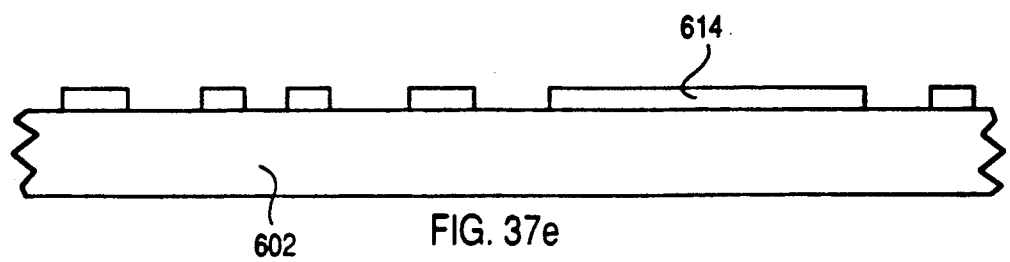
Figure 38A:
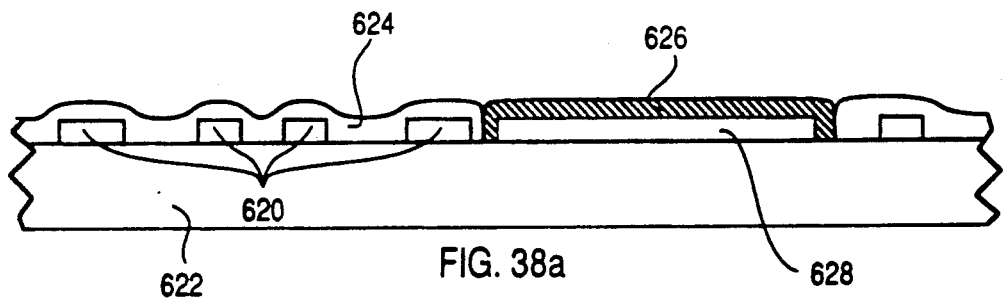
Figure 38B:
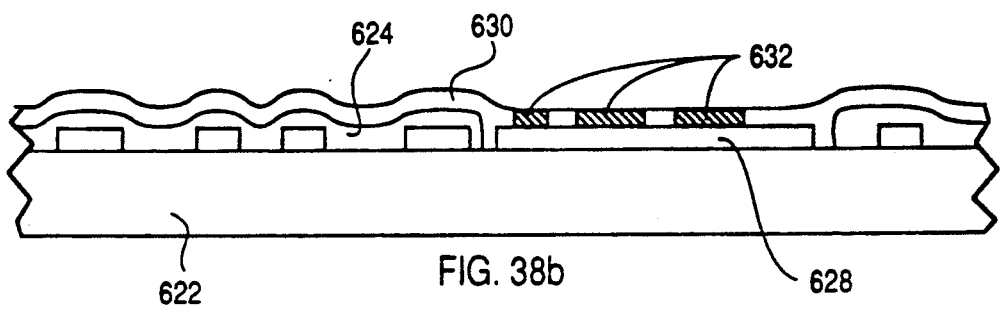
Figure 38C:
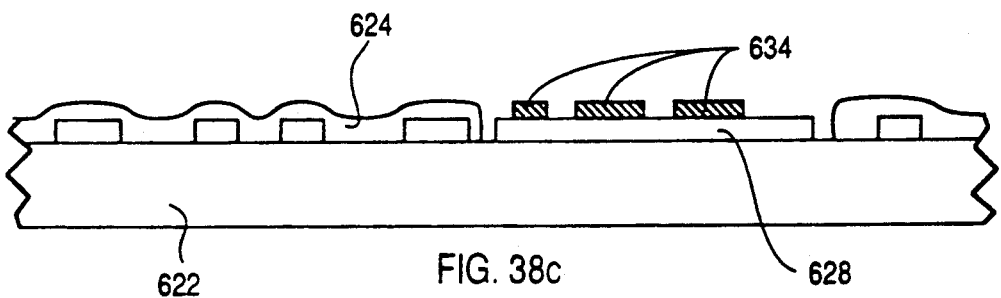
Figure 38D:
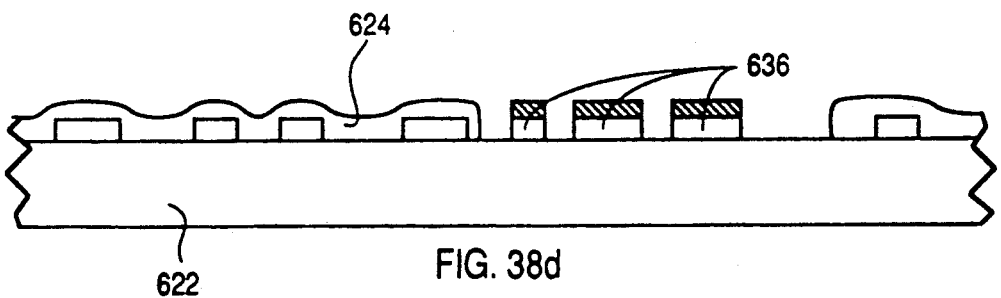
Figure 38E:
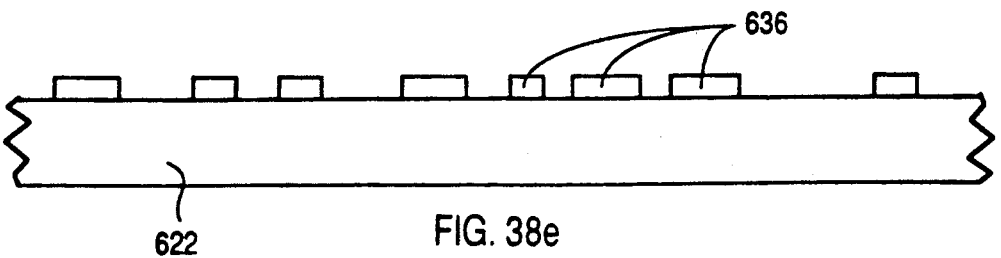
Figure 39A:
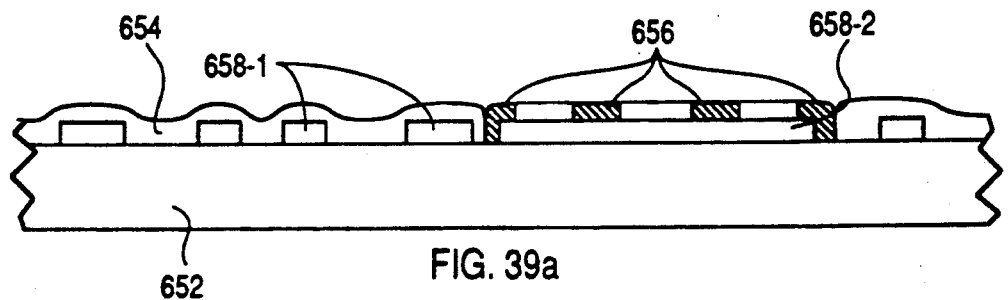
Figure 39B:
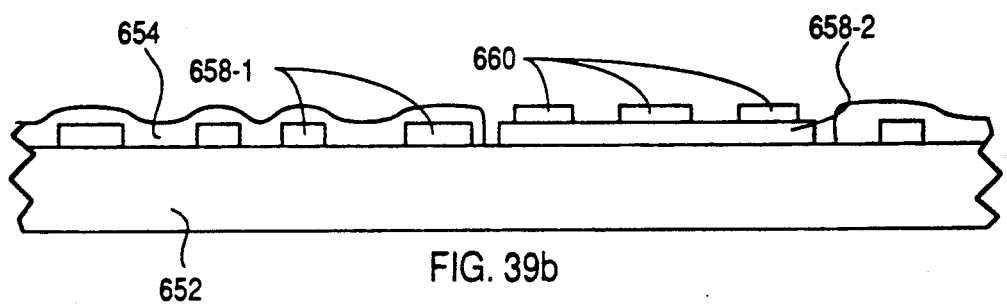
Figure 39C:
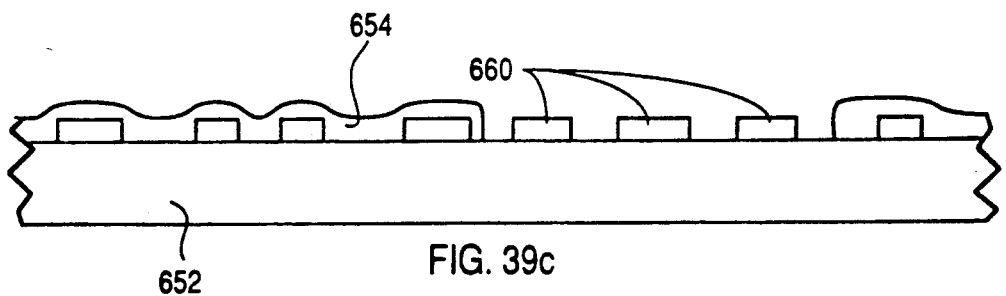
Figure 39D:
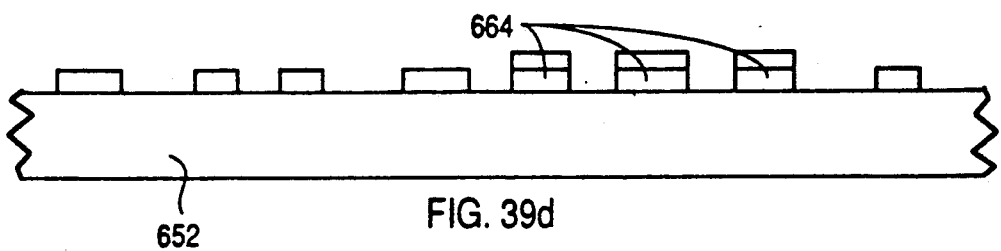

FIGS. 37(a) through 37(e) show in cross-section the use of positive optical resist and a fixed mask to form a pattern for etching a thin metal film 600 on a substrate 602 with the prior application, exposure and development of a negative optical resist layer 604 over an area requiring discretionary patterning as determined by the tester. The negative resist 604 over the discretionary areas prevents patterning of the metal film 600 by the positive resist and subsequent etch steps. In FIG. 37(a), negative resist layer 604 is applied over thin metal film layer 600. Negative resist layer 604 is exposed, by optical stepper equipment with shutter control and without a mask, at rectangular areas 606 (in the plane of substrate 602). The rectangular areas 606 are determined by the fine-grain tester as overlying defective ICLUs (not shown). Negative resist layer 604 is developed and the exposed areas such as area 606 remain.

In FIG. 37(*b*) a layer of optical positive resist 610 is applied and patterned by a fixed mask exposure step to define exposed areas 610-1 and unexposed areas 610-2. Portions 610-3 of the positive resist layer overlying the developed negative resist layer 606 do not pattern the thin film 600 in the steps shown in FIGS. 37(*c*) and 37(*d*).

The positive resist layer is developed as shown in FIG. 37(*c*), leaving a pattern 612 in the positive resist layer. Then the structure is etched as shown in FIG. 37(*d*); the discretionary area 614 thin film is left unpatterned, preventing interconnection to the underlying defective ICLUs. In the next step in FIG. 37(*e*), the remaining resist layers are stripped, leaving a patterned thin film with discretionary area 614 unpatterned. The result is the same as that shown by FIGS. 36(*a*) through 36(*d*), in that the metal film over the discretionary area is not patterned during the etch processing step, and is patterned by a subsequent patterning step.

FIGS. 38(*a*) through 38(*e*) show in cross-section the use of positive optical resist to protect an existing metal film pattern 620 on substrate 622, exposed and developed over an area requiring discretionary patterning, and the use of negative E-Beam or Ion-Beam resist applied over the developed positive resist to pattern a discretionary area.

Positive optical resist 624 is applied over a thin film 620 previously patterned by a fixed mask and exposed by shutter control (maskless) of stepper equipment over the discretionary areas 626 as pre-determined by the tester means. When developed, the unpatterned thin film 628 of the discretionary area is left exposed, and the remaining patterned portion of film 620 covered (protected from etch processing) by the developed (unexposed) positive resist 624. A negative E-Beam or Ion-Beam resist 630 is applied in FIG. 38(*b*) and a discretionary pattern 632 over the unpattern thin film areas 628 is exposed. The exposed pattern 634 is developed in FIG. 38(*c*), and the underlying thin film etched in FIG. 38(*d*), leaving areas 636. Thus, the previously patterned portions of the thin film are protected from the etch process step by the developed positive resist 624. The resists are stripped in FIG. 38(*e*) leaving the thin film 636 patterned by the combination of fixed mask and discretionary E-Beam or Ion-Beam method. This method is applicable to both metal and dielectric thin films.

FIGS. 39(*a*) through 39(*d*) show the patterning of a discretionary area of thin film 658 on substrate 652 with application of positive E-Beam or Ion-Beam resist. The resist area exposed by the E-Beam or Ion-Beam is removed by development of the resist, and therefore, unexposed resist is used to protect the previously patterned metal traces while patterning the metal film of the discretionary area.

Positive E-Beam or Ion-Beam resist 654 is applied in FIG. 39(*a*) and exposed with a discretionary pattern 656 over unpatterned areas of thin film 658-2 as determined by the tester in a previous processing step. The resist is developed in FIG. 39(*b*) leaving a pattern 660 to be etched into the unpatterned thin film 658-2 while the rest of the patterned thin film layer 658-1 is protected from the etch processing step by overlying resist 654. The pattern is etched in FIG. 39(*c*). Resist areas 654, 660 are stripped in FIG. 39(*d*) leaving discretionary patterns 664 with the portion of the thin film pattern by the fixed mask unaffected. This method is applicable to both metal and dielectric thin films.

FIGS. 39(*a*) through 39(*d*) thus show in cross-section the use of positive E-Beam or Ion-Beam resist to pattern a discretionary area while simultaneously protecting a pre-existing metal pattern. This method does not require a prior application of a resist to protect the existing metal pattern as shown in FIGS. 38(*a*) through 38(*d*).

The fine-grain testing capability of the tester allows the determination of a small area (typically less than 100 $\mu$m on a side) for discretionary patterning. The use of an optical stepper exposure under computer control determines the size and placement of rectangular exposure areas derived from the tester device database in combination with the various optical resists and prevents the patterning of the dielectric or metal film deposited over defective ICLUs after the initial pattern exposure of the resist by a fixed mask. Only these resulting unpatterned film areas over the defective ICLUs must subsequently be patterned by E-Beam or Ion-Beam processing rather than the complete pattern layer. This reduces the use of an E-Beam or Ion-Beam exposure to a limited area of the total substrate, typically less than 1%, and therefore, significantly lowers the cost that normally would be anticipated with using E-Beam or Ion-Beam equipment.

When etching a dielectric layer in a discretionary area predetermined by the tester, the resist used may vary from that described above for patterning a conductive or metal film. It may be more efficient to use a positive or negative resist when forming vias in a dielectric layer where metal film may require the opposite resist type.

Computer Aided Design (CAD) rip-up router software uses the defect database of the integrated circuit determined by the tester in accordance with the invention and the original placement and routing database of the circuit to generate the new patterns for the fine-grain discretionary areas to be patterned. These newly determined patterns become input control information to E-beam, Ion-Beam or optical exposure equipment, or as will be described below, Ion-Beam film deposition/etch patterning equipment.

Ion Beam For IC Wiring

Ion-beam film deposition or etch processing offers a potential cost reduction over the above-described E-beam or Ion-Beam exposure technique for completing the fine-grain discretionary wiring of an IC. Whereas E-beam and Ion-Beam are used to create fine-grain discretionary patterning in conjunction with the application of an existing master mask (reticle), either as a separate physical mask (the master reticle modified with required local fine-grain discretionary patterning changes) step, or a direct-write on wafer resist exposure mask step as provided above, the Ion-beam equipment can be used locally (in a fine-grain manner) to directly etch a dielectric thin film layer, or deposit dielectric or metal thin films, requiring no additional resist, deposition and etching steps. Ion-beam, like E-beam, is slower in processing time relative to optical exposure techniques, and offers equivalent sub-micron precision and pattern geometries. The method in accordance with the invention only requires routing changes that are local to an area typically less than 100 $\mu$m in diameter. The Ion-beam means makes the necessary discretionary wiring route changes on a layer-by-layer basis after the application of the fixed mask associated with a specific layer Ion-beam processing equipment is presently much cheaper then E-beam equipment. and available from several sources; the Ion-beam equipment of most recent note is the Seiko SMI-8100 which is suitable for use in accordance with the invention.

The application of the Ion-Beam means for the patterning of metal and dielectric (or passivation) thin films in conjunction with an optical stepper means as described above does not require the application of a negative resist or combined use of two resist layers. FIGS. 40(a) through 40(e) show in cross-section the use of positive optical resist to pattern a thin metal film 680 formed on substrate 682 with a fixed mask, and a second optical exposure (as described previously) over a discretionary area to blank out that portion of the fixed mask pattern and allow the underlying metal film to be etched away. In a subsequent processing step Ion-Beam equipment is used to deposit a metal trace pattern in the discretionary area which was etched free of the original thin metal film during the fixed mask patterning step. The Ion-Beam equipment directly specific to the size and placement data derived from the tester means database and the CAD circuit database.

Figure 40A:
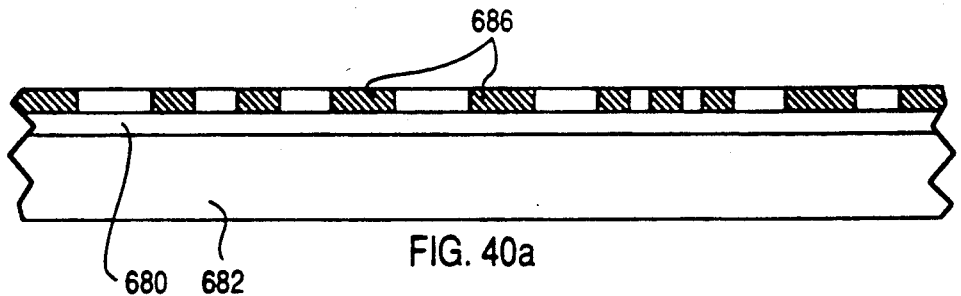
Figure 40B:
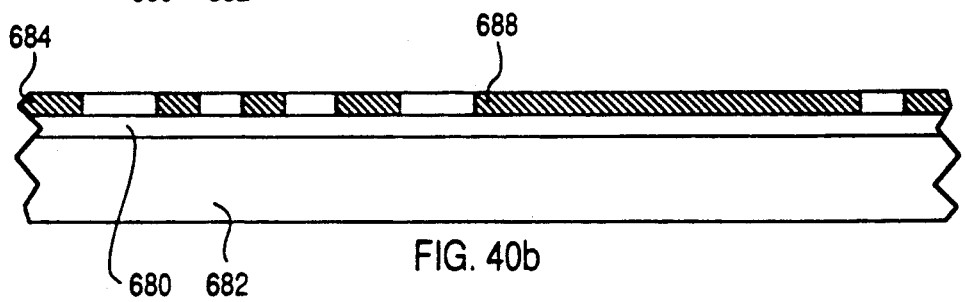
Figure 40C:
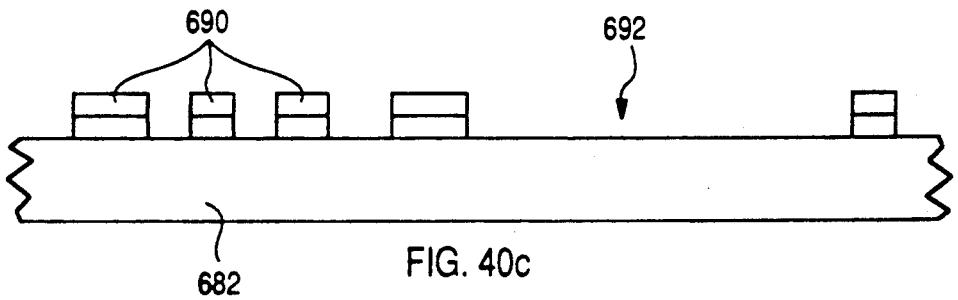
Figure 40D:
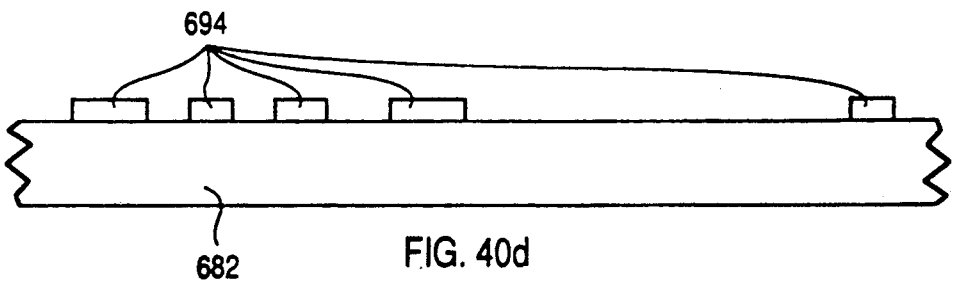
Figure 40E:
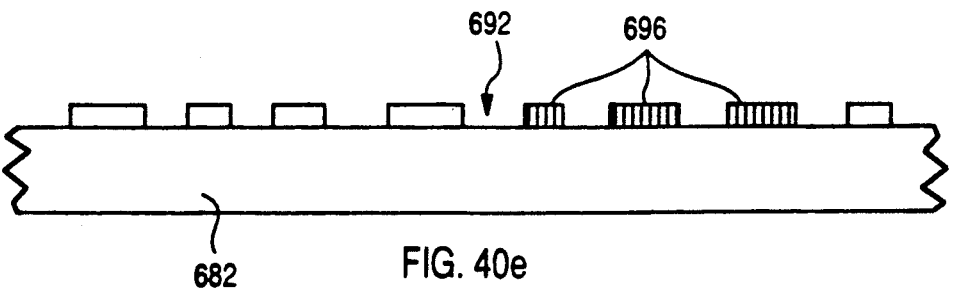

Positive optical resist 684 is applied in FIG. 40(a) over thin film 680 and portions 686 exposed by a fixed mask (not shown). Areas 688 of the thin film (see FIG. 40(b)) that require discretionary patterning, as determined by the tester, are given a second exposure (by shutter controlled maskless optical stepper equipment) to erase the pattern created by the fixed exposure. Resist 684 is developed in FIG. 40(c) and the resist pattern etched into the thin film 690, and the discretionary areas 692 are etched free of the thin film layer. The resist is stripped in FIG. 40(d) leaving the unaffected portions of the thin film 694 patterned by the fixed mask. Discretionary thin film depositions 696 are then made by the Ion-Beam in the discretionary areas 692, completing the patterning of the film. This method can be applied to dielectric layers in the same manner, except a negative resist is used in this case and the Ion-Beam means etches openings (vias) in the dielectric layer rather than depositing metal.

Discretionary metal patterns are directly deposited on the substrate by the Ion-Beam equipment. This requires that the rectangular areas in which discretionary patterning is to be performed be etched free of the metal film deposited for the fixed mask optical exposure patterning step. This is done by a separate optical stepper exposure step wherein the shutter of the stepper is positioned and set to open to the size of the rectangular areas identified for discretionary metal patterning and stepper control information is derived from the tester means defective ICLU database. The rectangular areas requiring discretionary patterning are etched clear of any deposited metal in the same step that the fixed mask patterning of the remaining areas of the metal film is processed. The Ion-Beam equipment subsequently deposits the desired discretionary metal traces from control data derived from the CAD rip-up router circuit database, computed specifically from the results in the tester means database which determined the areas that required discretionary patterning, into the rectangular areas that where etched clear of deposited metal film as shown in FIGS. 40(a) through 40(e), or etches required via openings in a dielectric layer.

Discretionary Interconnect with only First Via Layer Modification

Discretionary patterning modification limited only to the first via layer which separates ICLUs or circuit device elements from metal layer interconnections is sufficient to avoid connecting defective ICLUs or circuit device elements when there is complete redundancy of all ICLUs or circuit device elements. Metal traces are patterned as if to simultaneously interconnect primary and redundant circuit devices. The vias in the first dielectric via layer are only patterned (by fixed mask) to connect the primary device and not its redundant equivalent. If the tester determines that a primary device is defective, the vias corresponding to that primary device are closed or not opened, and vias corresponding to its redundant equivalent are opened. This isolates the defective device and connects its replacement without the need to change metallization patterning. The modification of the vias can be effected through local application of Ion-Beam equipment as described below using control data derived from the tester database and shown in cross-section by FIGS. 41(a) through 41(c).

Figure 41A:
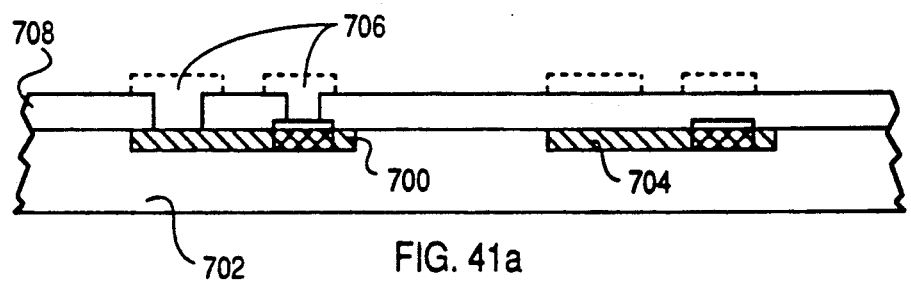

Defective ICLU 700 formed on substrate 702 in FIG. 41(a) is determined by the tester, and replaced by redundant ICLU 704. Vias 706 formed in a dielectric layer 708 allowing contact to the electrodes of a defective ICLU 700 26 are closed in FIG. 41(b) by dielectric deposition 710 in the vias 706 by Ion-Beam equipment. Vias 712 to the electrodes of designated replacement (redundant) ICLU 704 are opened by Ion-Beam equipment etching of the dielectric layer 708. Subsequent thin film metal deposition 714, 716 in FIG. 41(c) and patterning by fixed mask is made respectively to the closed vias 706 of defective ICLU 700 and the opened vias 712 of the redundant ICLU 704.

Figure 41B:
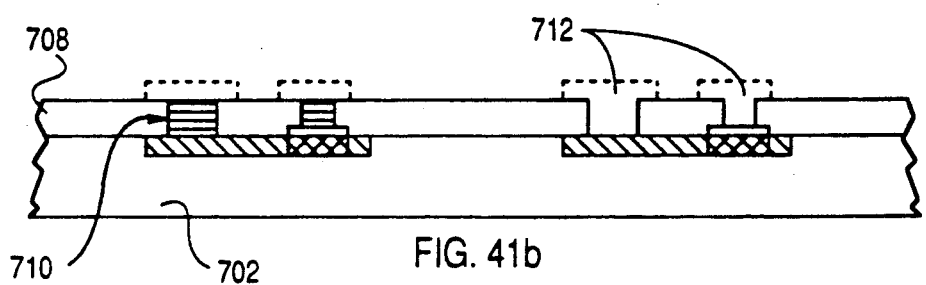
Figure 41C:
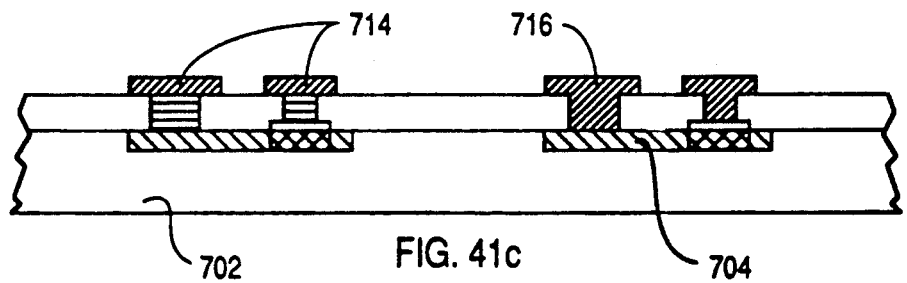

FIGS. 41(a) through 41(c) thus show in cross-section discretionary modification to a dielectric layer to prevent metal trace connection of a defective transistor, and to cause the connection of a spare (redundant) transistor to replace the defective transistor. This method does not require discretionary modification of the metal layer patterns or resist based patterning steps, but does require 100% redundancy of all transistors with a metallization interconnect pattern for the primary transistor and its replacement spare, and with vias in the dielectric layer that provide connection only for the primary transistor. The tester means determines if the primary transistor is defective, and if it is, provides control data for the closing of the vias of the primary transistor and etching of the vias in the dielectric layer of the spare transistor by an Ion-Beam (E-Beam and optical equipment can also be used to make discretionary via patterns in dielectric layers as shown above.)

Complete redundancy of circuit ICLU or device elements has practical application in logic and analog circuits where the order of the devices of the IC are not regular, or in flat panel display (e.g., Active Matric LCD) or imaging arrays where the density of ICLUs or circuit devices is low. This method of discretionary interconnect significantly simplifies the number of manufacturing steps to achieve discretionary interconnect. It does, however, come with the added cost of 100% or greater redundancy. There is a savings in this because logic circuits with redundancy do not require a correspondingly proportional increase in the area of an IC versus a circuit with no redundancy; this is due largely to the fact that the active device elements of logic circuits occupy typically less than 25% of the substrate area of an IC, the rest of the area is used by interconnect metallization.

The Testing and Localized Repair of Metallization Layers

The following describes the use of the tester in the testing and repair of via and metal layers of an IC. The tester method for testing that a via is open to a lower conductive layer is to place a probe point tip into the via and to make contact with the bottom of the via, or to deposit metallization into the via by means of standard metal deposition and etching techniques, and then using the tester to test electrical continuity among some number of mutually connected vias. Metal traces are tested with a tester by positioning probe points for contact among some number of metal traces that allow determination of the independent continuity of the various traces being contacted. The CAD database for the circuit is used to determine in an automated fashion the placement of the probe points during the fabrication of the tester surface, and the interconnection of the probe points with tester means logic is as described above.

The tester means fine-grain determination of a defective via or metal trace is followed by two preferred methods for remedy of the defects: 1) complete reprocessing of the whole substrate layer; or 2) local reprocessing of only the defective portion of the layer. The complete reprocessing of the substrate is performed with conventional IC processing such as etch removal of a patterned layer and redepositing and patterning it; the novel processing step being the use of the tester means to perform 100% testing of the substrate layer to determine whether substrate layer reprocessing is required. The reprocessing of a complete substrate layer may correct a specific metallization defect, but may also have a reasonable probability of introducing a new metallization defect. The local correction of metallization or via defects for a particular metal interconnect layer greatly reduces the probability that a new defect will be introduced.

Figure 42A:
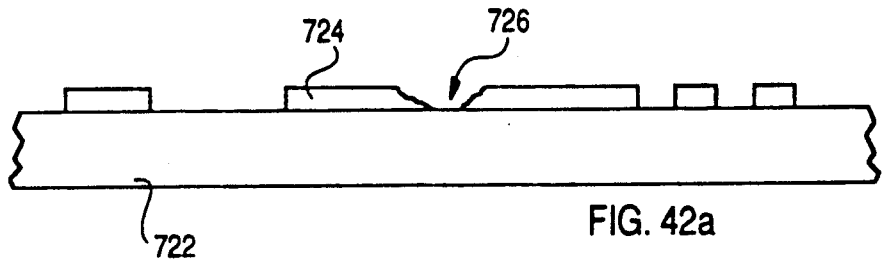
FIGS. 42(a) to 42(d) show repair of IC traces.
Figure 42B:
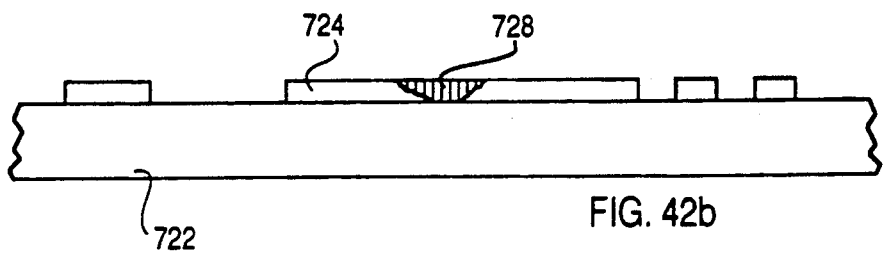

FIGS. 42(a) through 42(b) show in cross-section the use of Ion-Beam equipment to repair either a defective metal trace or via in a dielectric layer on a substrate 722 as determined by the tester. The defects are determined by the tester means, and the database formed by the tester means provides the positioning data for the Ion-Beam means to process the defects.

Defective metal traces 724 in FIG. 42(a) (caused by a break 726 in the trace 724) and located by the tester means are repaired by Ion-Beam deposition of metal along the metal trace 724. The metal deposition in FIG. 42(b) of the Ion-Beam fills the break 726 in the defective trace 724 by depositing a new metal trace 728 over the length of the existing defective metal trace 724.

Figure 42C:
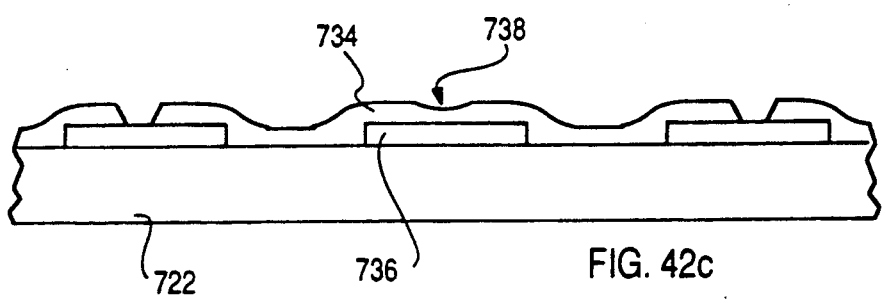
Figure 42D:
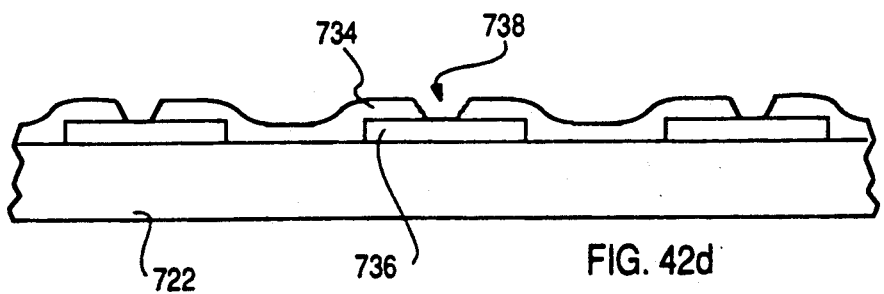

Defective dielectric vias 732 in FIG. 42(c) in dielectric thin films 734 found by the tester are incomplete openings in the dielectric layer 734 to an electrode 736 in a lower layer. The incomplete via 732 is opened in FIG. 42(d) by Ion-Beam equipment by etch removal of dielectric material 734 and so to complete the via opening 738.

Repair of defective via and metal trace patterning is not limited to the Ion-Beam deposition/etch method described, but application of resist with localized exposure E-Beam, Ion-Beam or optical exposure and etching of dielectric or metal thin films can also be used.

Fuses and Anti-Fuse Discretionary Interconnection

The tester means in accordance with the invention is used in one embodiment to access and blow fuses (i.e., open a metal trace or disconnect a metal trace) or antifuses (i.e., close or connect two metal traces) as a discretionary method of forming interconnections in a IC. This process is employed after a circuit is fabricated and prior to packaging in order to configure the final internal metal interconnections as in the case of PLAs (programmable logic arrays), or in circuit repair after functional IC testing. The tester used as a circuit programmer in the final steps of IC fabrication simplifies the design of the circuit since the tester probe points contact immediately adjacent to the fuse or antifuse device, and therefore, no additional interconnect traces or control logic internal to the circuit are required for access to the fuse/antifuse device. This gives the capability to make incremental corrections without obsoleting manufacturing tooling or inventory. The tester means contacts small metal contacts (less than 1 mil square) positioned as appropriate (i.e., arbitrarily) anywhere on the surface of the IC which would directly access the electrodes of a fuse or anti-fuse or metal traces (electrodes) of a fuse or anti-fuse device. The tester then applies the appropriate voltage at the metal contacts to blow the fuse or anti-fuse device.

The use of fuses and anti-fuses may also be used to disconnect and/or connect ICLUs from a circuit during manufacturing. The tester means, once it has determined that an ICLU is defective, is directed to break or make associated fuse and anti-fuse links in the same step or in a subsequent manufacturing step.

Burn-In Testing

The tester in accordance with the invention in its implementation with integrated logic in the tester surface is significantly cheaper to manufacture than present IC testing systems. This lower cost is consistent with the familiar historical cost savings that have resulted from use of higher levels of circuit integration. The lower cost of the present invention in combination with its ability to provide extremely high probe point counts with geometries of 1 mil diameter or less provides a cost effective method in accordance with the invention to be used for burn-in of the ICLUs or circuit devices prior to completion of IC fabrication (i.e., prior to circuit device metallization interconnection).

Burn-in of ICLUs or circuit devices is accomplished by applying the tester to the DUT over extended periods of time, such as several seconds to several hours or several days or longer. The mechanical contact process of the tester is unchanged; however, the area of the DUT that is processed per contact would be maximized and the mechanical operation of the tester head equipment, simplified so as to contact only one area of the DUT substrate, and therefore, lower equipment costs. The burn-in of ICLUs includes the operation of the ICLUs under stressing voltage and/or current loading. During the extended time that a tester means is in contact with the DUT, the ICLUs of the DUT are periodically tested repeatedly or biased at a voltaged level in a static condition.

The ability of the burn-in method in accordance with the invention to tolerate higher average operating temperatures (since the materials used in the fabrication of the tester surface are stable to temperatures in excess of 200° C.) allows the ICLUs to be subjected to what is called accelerated aging by operation of the ICLUs at elevated temperatures (i.e., 25° to 150° C. or more over normal ambient temperature); this is a standard military functional qualification method for completed ICs. Burn-in and burn-in with accelerated aging have been found to extend the MTTF (Mean Time To Failure) of a system by causing the marginal IC components of the system which would most likely fail in the first twenty-four months of operation to fail before the system begins its useful life. ICLUs can be tested in this fashion in accordance with the invention and provide increased MTTF at the IC component level without significant change to the procedures of ICLU testing.

This method includes the use of the tester means to perform a function in addition to testing. The tester means is brought into prolonged contact with a large number of ICLUs under stressing electrical and thermal conditions in an effort to cause those ICLUs or device elements of marginal manufacture to fail. This is a novel reliability assurance manufacturing step.

I claim:

1. A method of fine grain testing an integrated circuit at the device level comprising the steps of:
    electrically contacting each one of a plurality of devices in the integrated circuit;
    applying an electrical voltage to each one of the devices for a period of at least one second; and
    determining after the period if each of the devices is functional 2. The method of claim 1, further comprising the step of elevating an ambient temperature of the integrated circuit by at least 25° C.

3. The method of claim 1, further comprising, after the step of determining, the step of interconnecting the devices.

4. A method for providing discretionary interconnections at any location in an integrated circuit comprising the steps of:
    providing a plurality of discretionary metal traces each being in a conductive or in a nonconductive state in the integrated circuit, each metal trace being contacted at each of its two ends by a metal contact less than one mil by one mil in size located immediately adjacent to the metal trace; and
    contacting the two contacts at the ends of one trace and applying a voltage to the two contacts so a current flows through the metal trace, thereby causing the trace to change its state into the other state.

5. The method of claim 4, further comprising the step of testing the metal traces during the fabrication of the interconnections of an integrated circuit.

6. The method of claim 4, wherein each metal contact has a width of less than about 6 microns.

7. A method of testing an integrated circuit comprising the steps of:
    providing a tester having at least one thousand probe points on a first side of the tester;
    electrically contacting individual devices in the integrated circuit with the probe points;
    vibrating the tester so as to achieve improved electrical contact; and
    electrically testing the devices by providing signals to the devices through the probe points.

8. The method of claim 7, further comprising the steps of:
    providing a fluid on a second side of the tester; and
    vibrating the fluid so as to vibrate the tester.

9. The method of claim 7, further comprising the steps of:
    providing a piezoelectric layer on a second side of the tester; and providing a varying electrical signal to the piezoelectric layer so as to vibrate the tester.

10. A method of testing integrated circuit logic units each including electronic devices, circuitry, and contact points formed on a semiconductor wafer, comprising the steps of:
    providing a support for said wafer;
    providing a flexible tester surface having a thickness of no greater than 15 microns of inorganic material and having a number of probe points corresponding to said contact points of said wafer;
    electrically interconnecting said probe points of said flexible tester surface and said contact points of said wafer by moving said support and said surface into proximity; and
    supplying diagnostic signals to said flexible tester surfaces for testing said electrical devices and circuitry.

11. A method of testing as in claim 10 further comprising the step of separating said wafer into a plurality of dice prior to the step of electrically interconnecting.

12. A method of testing as in claim 11, further comprising the step of completing manufacturing of an integrated circuit including a plurality of said integrated circuit logic units prior to the step of electrically interconnecting.

13. A method as in claim 10, wherein in the step of supplying, a plurality of said devices are supplied simultaneously.

* * * * *